US006815221B2

(12) United States Patent
Kim et al.

(10) Patent No.: US 6,815,221 B2
(45) Date of Patent: Nov. 9, 2004

(54) METHOD FOR MANUFACTURING CAPACITOR OF SEMICONDUCTOR MEMORY DEVICE CONTROLLING THERMAL BUDGET

(75) Inventors: Wan-don Kim, Yongin (KR); Cha-young Yoo, Suwon (KR); Doo-sup Hwang, Yongin (KR); Jae-hyun Joo, Seoul (KR); Eun-ae Chung, Daegu (KR); Yong-kuk Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 220 days.

(21) Appl. No.: 10/105,181

(22) Filed: Mar. 25, 2002

(65) Prior Publication Data

US 2003/0054605 A1 Mar. 20, 2003

(30) Foreign Application Priority Data

Sep. 17, 2001 (KR) ........................................ 2001-57263

(51) Int. Cl.[7] ................................................ H01G 7/06
(52) U.S. Cl. ............................................ 438/3; 438/240
(58) Field of Search ............................. 438/3, 238–240, 438/253–256, 396–399

(56) References Cited

U.S. PATENT DOCUMENTS 6,174,564 B1 * 1/2001 Scott et al. ............... 427/126.3
6,492,222 B1 * 12/2002 Xing .......................... 438/240
6,492,241 B1 * 12/2002 Rhodes et al. .............. 438/386

FOREIGN PATENT DOCUMENTS

JP          11-87629        3/1999   ........... H01L/27/04

* cited by examiner

Primary Examiner—H. Jey Tsai
(74) Attorney, Agent, or Firm—Mills & Onello LLP

(57) ABSTRACT

A method for manufacturing a capacitor of a semiconductor memory device by controlling thermal budgets is provided. In the method for manufacturing a capacitor of a semiconductor memory device, a lower electrode is formed on a semiconductor substrate. The lower electrode is heat-treated with a first thermal budget. A dielectric layer is formed on the heat-treated lower electrode. The dielectric layer is crystallized by heat-treating the dielectric layer with a second thermal budget which is smaller than the first thermal budget.

67 Claims, 20 Drawing Sheets

METHOD FOR MANUFACTURING CAPACITOR OF SEMICONDUCTOR MEMORY DEVICE CONTROLLING THERMAL BUDGET

BACKGROUND OF THE INVENTION

1. Field of the Invention

The present invention relates to a method for manufacturing a capacitor of a semiconductor memory device, and more particularly, to a method for manufacturing a metal-insulator-metal (MIM) capacitor of a semiconductor memory device, which has lower and upper electrodes formed of metal, controlling a thermal budget.

2. Description of the Related Art

As the area of the cross section of cells decreases due to increases in the integration density of semiconductor devices, it becomes more difficult to obtain sufficient capacitance to operate a device. Accordingly, in order to reduce the thickness of dielectric layers in the manufacture of a capacitor necessary to operate a semiconductor memory device of Gigabit capacity or more and increase the effective area of the cross section of the capacitor, various studies have been carried out to form a storage node having a three-dimensional structure. However, it is very difficult to obtain effective capacitance required to operate a semiconductor memory device of Gigabit or higher capacity through the use of a conventional oxide-nitride-oxide (ONO) dielectric layer. Accordingly, a high dielectric layer which is formed of metal oxide, such as $Ta_2O_5$ or TaON, and a material having a perovskite structure, such as $(Ba, Sr)TiO_3$ (BST), $SrTiO_3$ (STO), $BaTiO_3$, $Pb(Zr, Ti)O_3$ (PZT), or $(Pb, La)(Zr, Ti)O_3$ (PLZT), has been suggested.

In the manufacture of a capacitor using such a high dielectric layer, it is more preferable to manufacture a MIM capacitor than to manufacture a capacitor employing a polysilicon electrode because the polysilicon electrode needs a low dielectric layer for preventing a dielectric layer from reacting with the polysilicon electrode, and thus there is a limit to which the capacitance can be increased using the polysilicon electrode. On the other hand, in the case of the MIM capacitor using an electrode formed of a metal having a high work function, a barrier layer is formed at the interface between the metal electrode and a dielectric layer and controls leakage current. Accordingly, it is possible to obtain a capacitor having stable electrical characteristics without introducing a low dielectric layer and thus increase capacitance by reducing the thickness of a dielectric layer.

In order to obtain a capacitor having high dielectric characteristics required to operate a semiconductor memory device of Gigabit or higher capacity from a MIM capacitor, a crystallized dielectric layer must be used because a dielectric material, such as $Ta_2O_4$, TaON, BST, or STO, which is generally used to form a dielectric layer of a MIM capacitor, has 2–10 times better dielectric characteristics in a crystallized state than in an amorphous state.

There are methods for crystallizing a dielectric layer including a method for forming a crystalline dielectric layer by depositing and growing a dielectric layer at a high temperature and a method for forming a crystalline dielectric layer by depositing an amorphous dielectric layer and heat-treating the amorphous dielectric layer. However, the method for crystallizing a dielectric layer by depositing the dielectric layer at a high temperature has problems in which a high temperature necessary to sufficiently crystallize the dielectric layer may cause the step coverage characteristics of the dielectric layer to deteriorate and may oxidize a lower electrode and a TiN-based diffusion barrier layer. Accordingly, the method for crystallizing a dielectric layer by depositing an amorphous dielectric layer and heat-treating the amorphous dielectric layer at a high temperature is considered to be more effective to manufacture a MIM capacitor having a crystalline dielectric layer.

According to a conventional method for manufacturing a capacitor, in order to manufacture a MIM capacitor using a method for forming a crystalline dielectric layer through a heat treatment, a lower electrode is formed on a semiconductor substrate, on which underlying structures are already formed. Next, an amorphous dielectric layer is formed on the lower electrode and is heat-treated at a high temperature to be crystallized. Next, an upper electrode is formed on the crystallized dielectric layer. Here, in order to sufficiently crystallize the amorphous dielectric layer, a heat treatment performed at a high temperature is necessary. However, according to this conventional method, the electrodes may cause tensile stress affecting the dielectric layer due to the difference in thermal expansion coefficients between the electrodes and the dielectric layer and a coarsening effect caused by the grain growth of the material of the electrodes as well as the crystallization of the amorphous dielectric layer when heat-treating the amorphous dielectric layer. Accordingly, the physical and electrical characteristics of the MIM capacitor may deteriorate.

In order to solve the above problems, according to another conventional method for manufacturing a MIM capacitor, a lower electrode is heat treated before deposition of a dielectric layer. This method prevents tensile stress from affecting the dielectric layer and prevents the lower electrode from being deformed during the heat treatment of the dielectric layer by allowing the coarsening effect caused by the grain growth of the material of the lower electrode to be produced before depositing the dielectric layer. However, this method has a problem in that discontinuities may be generated at the lower electrode because of coagulation of the lower electrode when heat treating the lower electrode. In addition, even if the lower electrode is heat treated, it is impossible to obtain a stable leakage current value necessary to operate a device. Accordingly, it is difficult to obtain a MIM capacitor having stable electrical characteristics through heat treatment of the lower electrode.

SUMMARY OF THE INVENTION

To solve the above-described problems, it is an object of the present invention to provide a method for manufacturing a MIM capacitor of a semiconductor memory device which is capable of preventing a lower electrode from being deformed during heat treating a dielectric layer to be crystallized and thus improving the physical and electrical characteristics of the MIM capacitor.

In accordance with the inveniton, there is provided a method for manufacturing a capacitor of a semiconductor memory device. A lower electrode is formed on a semiconductor substrate. The lower electrode is heat-treated with a first thermal budget. A dielectric layer is formed on the heat-treated lower electrode. The dielectric layer is crystallized by heat-treating the dielectric layer with a second thermal budget which is smaller than the first thermal budget.

The lower electrode may be formed of a noble metal, conductive noble metal oxide, or conductive metal oxide. Preferably, the lower electrode is formed of Pt, Ru, Ir, PtO, $RuO_2$, $IrO_2$, $SrRuO_3$, $BaSrRuO_3$, or LaScCo.

The dielectric layer may be formed of a metal oxide layer or a material layer having a perovskite structure. Preferably, the dielectric layer is a mono layer including a material selected from among $Ta_2O_5$, $Al_2O_3$, TaON, (Ba, Sr)$TiO_3$ (BST), $SrTiO_3$(STO), $BaTiO_3$(BTO), $PbTiO_3$, Pb(Zr, Ti)$O_3$ (PZT), $SrBi_2Ta_2O_9$(SBT), (Pb, La)(Zr, Ti)$O_3$, and $Bi_4Ti_3O_{12}$ or a composite layer of any of the above.

In one embodiment, in heat-treating the lower electrode and crystallizing the dielectric layer, the first and second thermal budgets are adjusted by controlling any of the temperature, time, and method of their respective heat treatments.

In one embodiment, in heat-treating the lower electrode and crystallizing the dielectric layer, the first and second thermal budgets are adjusted by controlling the temperature of their respective heat treatments. For example, the dielectric layer can be heat-treated at a first temperature which is higher than the crystallization temperature of the dielectric layer, and the lower electrode can be heat-treated at a second temperature which is higher than the first temperature by 50–200° C. In heat-treating the lower electrode and crystallizing the dielectric layer, the first and second thermal budgets can be adjusted by controlling the time of their respective heat treatments. For example, the period of time for which the lower electrode is heat-treated can be longer than the period of time for which the dielectric layer is heat-treated. In a case where the lower electrode and the dielectric layer are heat-treated using furnaces, the period of time for which the lower electrode is heat-treated can be longer than the period of time for which the dielectric layer is heat-treated by 30 minutes–2 hours. In heat-treating the lower electrode and crystallizing the dielectric layer, the first and second thermal budgets can be adjusted by using different heat-treatment methods. For example, a heat treatment using a furnace can be used to obtain the first thermal budget in heat-treating the lower electrode, and rapid thermal annealing (RTA) or plasma annealing can be used to obtain the second thermal budget in crystallizing the dielectric layer. Alternatively, in heat-treating the lower electrode and crystallizing the dielectric layer, the first and second thermal budgets may also be adjusted by controlling at least two out of the temperature, time, and method of their respective heat treatments.

The lower electrode may be heat-treated at a temperature of 500–850° C. In addition, the lower electrode may be heat-treated in a gas atmosphere generated from a gas selected from among $N_2$, $O_2$, $H_2$, $N_2O$, NO, $NO_2$, Ar, and $O_3$. Alternatively, the lower electrode may be heat-treated in a vacuum atmosphere.

The dielectric layer may be heat-treated in a gas atmosphere generated from a gas selected from among $N_2$, $O_2$, $H_2$, $N_2O$, NO, $NO_2$, Ar, and $O_3$. The dielectric layer may be heat-treated in a vacuum or plasma atmosphere.

The method for manufacturing a capacitor of a semiconductor memory device according to the first embodiment of the present invention may further include forming a coagulation prevention layer on the lower electrode. Here, the lower electrode is heat-treated with the first thermal budget after forming the coagulation prevention layer. The coagulation prevention layer may be a mono layer including a material selected from among $SiO_2$, photoresist, $Si_3N_4$, $Ta_2O_5$, $Al_2O_3$, $SrTiO_3$(STO), (Ba, Sr)$TiO_3$(BST), $PbTiO_3$, Pb(Zr, Ti)$O_3$(PZT), $SrBi_2Ta_2O_5$(SBT), (Pb, La)(Zr, Ti)$O_3$, $Bi_4Ti_3O_{12}$, $BaTiO_3$(BTO), and organic polymer or a composite layer of the above. The method for manufacturing a capacitor of a semiconductor memory device according to the first embodiment of the present invention may further include removing the coagulation prevention layer after heat-treating the lower electrode with the first thermal budget. The coagulation prevention layer may be removed by dry or wet etching.

The method for manufacturing a capacitor of a semiconductor memory device may further include forming a sacrificial insulating layer pattern on the semiconductor substrate to define a storage node hole. Here, the lower electrode is formed at the sidewalls of the sacrificial insulating layer pattern in the storage node hole. The sacrificial insulating layer pattern can be formed of $SiO_2$.

In this embodiment, in order to form the lower electrode, a conductive layer is formed covering the top surface and sidewalls of the sacrificial insulating layer pattern and the bottom surface of the storage node hole. An etching stop layer is formed to a sufficient thickness to completely fill the storage node hole on the conductive layer. A concave-type lower electrode comprised of the conductive layer remaining only in the storage node hole is formed by removing portions of the etching stop layer and the conductive layer until the conductive layer covering the top surface of the sacrificial insulating layer pattern is removed. The etching stop layer remaining in the storage node hole is removed. The conductive layer may be formed of Pt, Ru, Ir, PtO, $RuO_2$, $IrO_2$, $SrRuO_3$, $BaSrRuO_3$, or LaScCo. Here, the lower electrode is heat-treated with the first thermal budget using the etching stop layer as a coagulation prevention layer before removing the etching stop layer remaining in the storage node hole.

The sacrificial insulating layer pattern may have a structure in which a first insulating layer pattern, an etching stopper pattern, and a second insulating layer pattern are sequentially stacked. In order to form the lower electrode, a conductive layer is formed covering the top surface and sidewalls of the sacrificial insulating layer pattern and the bottom surface of the storage node hole. An etching stop layer is formed to a sufficient thickness to completely fill the storage node hole on the conductive layer. A cylinder-type lower electrode comprised of the conductive layer remaining only in the storage node hole is formed by removing portions of the etching stop layer and the conductive layer until the conductive layer covering the sacrificial insulating layer pattern is removed. The etching stop layer remaining in the storage node hole is removed. Here, the lower electrode is heat-treated with the first thermal budget using the etching stop layer as a coagulation prevention layer before removing the etching stop layer remaining in the storage node hole. The method for manufacturing a capacitor of a semiconductor memory device according to the first embodiment of the present invention may further include removing the first insulating layer pattern after heat-treating the lower electrode with the first thermal budget. Here, the dielectric layer is formed on the etching stopper pattern and the lower electrode.

In order to form the lower electrode, a conductive layer is formed to a sufficient thickness to completely fill the storage node hole on the semiconductor substrate on which the sacrificial insulating layer pattern is formed. A stack-type lower electrode comprised of the conductive layer remaining only in the storage node hole is formed by removing the conductive layer on the sacrificial insulating layer pattern.

The method for manufacturing a capacitor of a semiconductor memory device according to the first embodiment of the present invention may further include forming an upper electrode on the dielectric layer. Here, the dielectric layer may be heat-treated with the second thermal budget before or after forming the upper electrode. The upper electrode may be formed of a noble metal, conductive noble metal oxide, or conductive metal oxide. Preferably, the upper electrode is formed of Pt, Ru, Ir, PtO, $RuO_2$, $IrO_2$, $SrRuO_3$, $BaSrRuO_3$, or LaScCo.

In accordance with the invention, there is provided another method for manufacturing a capacitor of a semiconductor memory device. A conductive layer is formed on a semiconductor substrate. The conductive layer is heat-treated with a first thermal budget. A lower electrode is formed by patterning the conductive layer. A dielectric layer is formed on the heat-treated lower electrode. The dielectric layer is crystallized by heat-treating the dielectric layer with a second thermal budget which is smaller than the first thermal budget. An upper electrode is formed on the dielectric layer.

The method for manufacturing a capacitor of a semiconductor memory device according to the second embodiment of the present invention may further include forming an etching stop layer on the conductive layer and removing the etching stop layer after forming the lower electrode. Here, the conductive layer is heat-treated with the first thermal budget after forming the etching stop layer.

According to the present invention, a lower electrode is heat-treated with a thermal budget greater than a thermal budget applied to heat-treat a dielectric layer to be crystallized before the dielectric layer is deposited on the lower electrode. Accordingly, the lower electrode can be sufficiently coarsened through grain growth before the heat treatment of the dielectric layer. In addition, it is possible to obtain a capacitor having stable leakage current characteristics necessary to operate a device by preventing the lower electrode from being deformed during the heat treatment of the dielectric layer and thus effectively preventing tensile stress from affecting the dielectric layer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
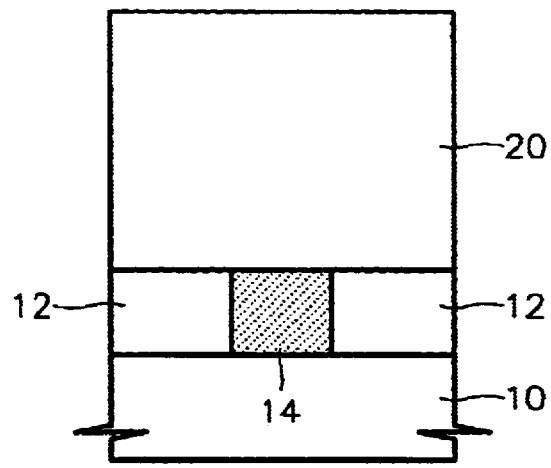
FIGS. 1A through 1J are cross-sectional views illustrating a method for manufacturing a capacitor of a semiconductor memory device according to a first embodiment of the present invention.

FIGS. 1A through 1J are cross-sectional views illustrating a method for manufacturing a capacitor of a semiconductor memory device according to a first embodiment of the present invention. Referring to FIG. 1A, a conductive plug 14 is formed through an interlayer insulating layer 12 on a semiconductor substrate 10 to contact a conductive region on the semiconductor substrate 10, and a sacrificial insulating layer 20 is formed to a thickness of about 10,000 Å on the semiconductor substrate 10. The conductive plug 14 may be formed of TiN. The sacrificial insulating layer 20 is used to form a mold, which is used to form a lower electrode in a subsequent process, and is formed of $SiO_2$.

Figure 1B:
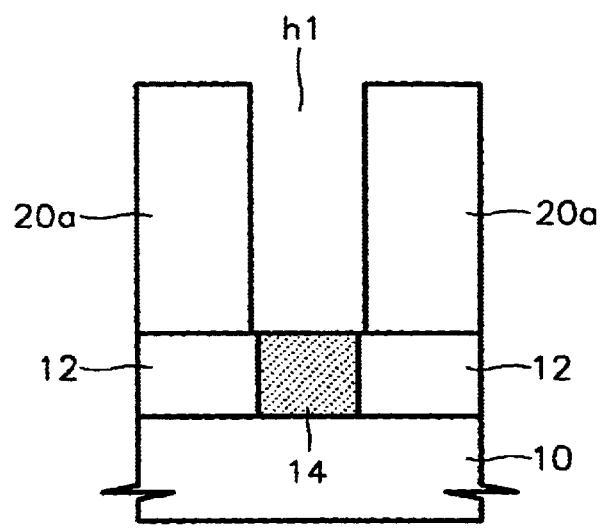

Referring to FIG. 1B, the sacrificial insulating layer 20 is patterned to form a sacrificial insulating layer pattern 20a defining a storage node hole h1, through which the conductive plug 14 is exposed.

Figure 1C:
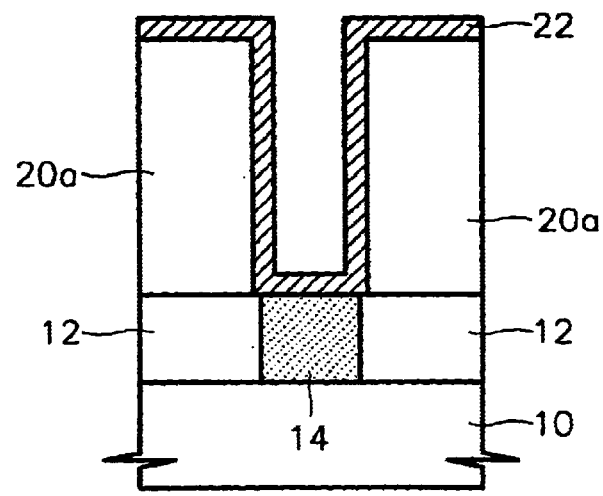

Referring to FIG. 1C, a conductive layer 22 is formed to a thickness of about 200–500 Å to cover the top surface and sidewalls of the sacrificial insulating layer pattern 20a and the bottom surface of the storage node hole h1. The conductive layer 22 may be formed of a noble metal, such as Pt, Ru, or Ir, conductive noble metal oxide, such as PtO, $RuO_2$, or $IrO_2$, or conductive metal oxide, such as $SrRuO_3$, $BaSrRuO_3$, or LaScCo. It is preferable to form the conductive layer 22 by chemical vapor deposition (CVD) or atomic layer deposition (ALD), which shows superior step coverage characteristics.

Figure 1D:
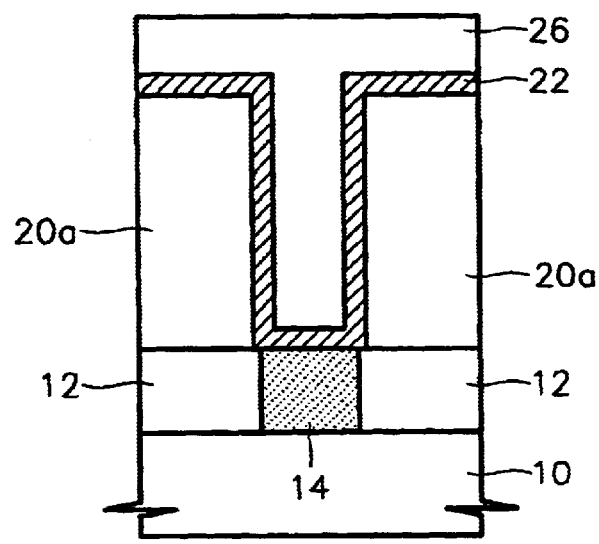

Referring to FIG. 1D, an etching stop layer 26 is formed to a sufficient thickness to completely fill the storage node hole h1 on the conductive layer 22. The etching stop layer 26 is formed to protect a lower electrode from a subsequent process of isolating nodes and may be a mono layer of a material selected from among $SiO_2$, photoresist, $Si_3N_4$, $Ta_2O_5$, $Al_2O_3$, $SrTiO_3$ STO, (Ba, Sr)$TiO_3$(BST), $PbTiO_3$, Pb(Zr, Ti)$O_3$(PZT), $SrBi_2Ta_2O_5$(SBT), (Pb, La)(Zr, Ti)$O_3$, $Bi_4Ti_3O_{12}$, $BaTiO_3$(BTO), and organic polymer or a composite layer of these materials.

Figure 1E:
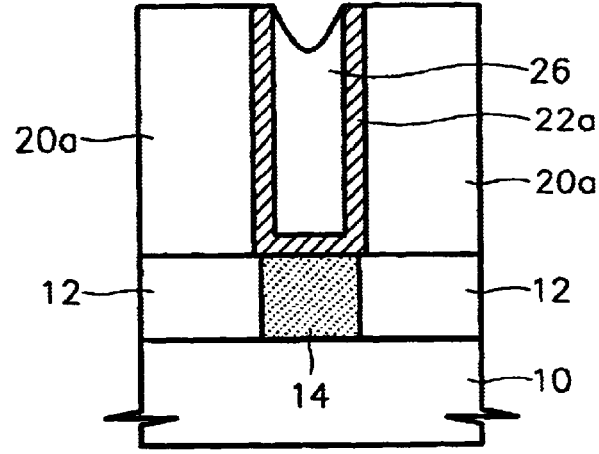

Referring to FIG. 1E, predetermined portions of the etching stop layer 26 and the conductive layer 22 are removed until the conductive layer 22 covering the top surface of the sacrificial insulating layer pattern 20a is removed, thereby forming a concave-type lower electrode 22a comprised of the conductive layer 22 remaining in the storage node hole h1. Here, parts of the etching stop layer 26 remain on the lower electrode 22a in the storage node hole h1.

Figure 1F:
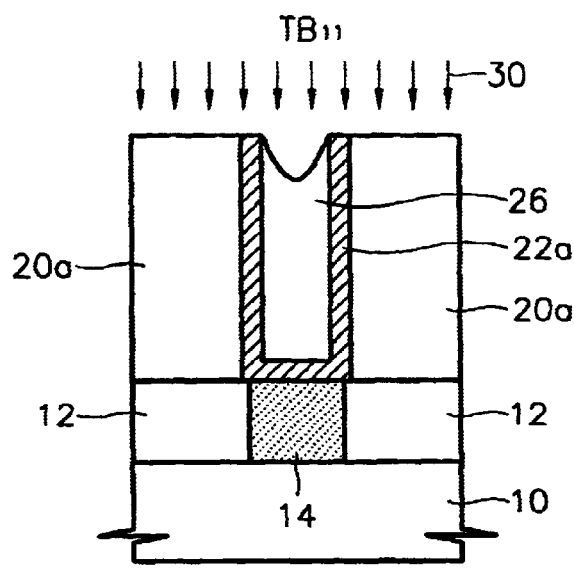

Referring to FIG. 1F, the lower electrode 22a is heat-treated (30) with a first thermal budget $TB_{11}$ using the remaining etching stop layer 26 as a coagulation prevention layer. Here, it is also preferable that the etching stop layer 26 be completely removed before the heat treatment (30) of the lower electrode 22a, a coagulation prevention layer is formed on the lower electrode 22a, and then the lower electrode 22a is heat-treated with the first heat budget $TB_{11}$.

The first thermal budget $TB_{11}$ is adjusted greater than a thermal budget applied to crystallize a dielectric layer in a subsequent process. In order to heat-treat (30) the lower electrode 22a with the first thermal budget $TB_{11}$ greater than the thermal budget applied to crystallize a dielectric layer, one or more parameters including heat treatment temperature, heat treatment time, or a heat treatment method may be varied.

In a case where the first thermal budget $TB_{11}$ applied to heat-treat (30) the lower electrode 22a is adjusted by controlling heat treatment temperature, the temperature required to heat-treat (30) the lower electrode 22a is adjusted higher than the treatment temperature required to heat-treat a dielectric layer to be crystallized by about 50–200° C. In a case where the first thermal budget $TB_{11}$ applied to heat-treat (30) the lower electrode 22a is adjusted by controlling heat treatment time, the period of time for which the lower electrode 22a is heat-treated (30) is adjusted to be longer than the period of time for which a dielectric layer is heat-treated to be crystallized. For example, supposing that the process of heat-treating (30) the lower electrode 22a and the process of heat-treating a dielectric layer to be crystallized are performed in a furnace using the same method, the lower electrode 22a is heat-treated (30) for a time period longer than the time taken to crystallize the dielectric layer by about 30 minutes–2 hours. In addition, in a case where the first thermal budget $TB_{11}$ applied to heat-treat (30) the lower electrode 22a is adjusted by using different heat treatment methods, the lower electrode 22a is heat-treated (30) using a heat treatment method capable of providing a relatively great thermal budget, and a dielectric layer is heat-treated to be crystallized using a heat treatment method capable of providing a relatively small thermal budget. For example, the lower electrode 22a may be heat-treated (30) using a furnace in order to obtain the first thermal budget $TB_{11}$, and the dielectric layer may be heat-treated by rapid thermal annealing (RTA) or plasma annealing in order to obtain a smaller thermal budget than the first thermal budget $TB_{11}$. At least two out of the three parameters including heat treatment temperature, heat treatment time, and a heat treatment method may be varied.

The lower electrode 22a is preferably heat-treated (30) at a temperature of about 500–850° C. In addition, the lower electrode 22a may be heat-treated (30) in a gas atmosphere formed of a gas selected from among $N_2$, $O_2$, $H_2$, $N_2O$, NO, $NO_2$, Ar, and $O_3$. Alternatively, the lower electrode 22a may be heat-treated (30) in a vacuum atmosphere or a plasma atmosphere.

Figure 1G:
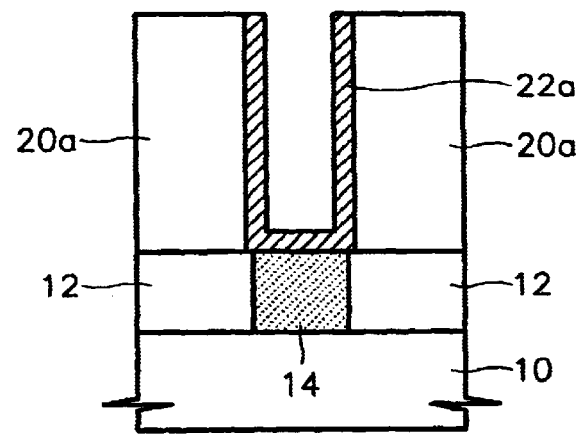

Referring to FIG. 1G, the etching stop layer 26 remaining on the lower electrode 22a that is heat-treated is removed by dry or wet etching so that the top surface of the lower electrode 22a can be exposed.

Figure 1H:
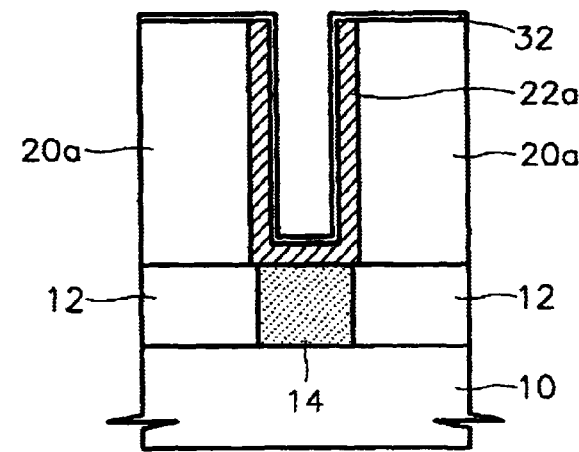

Referring to FIG. 1H, an amorphous dielectric layer 32 is formed on the lower electrode 22a and the sacrificial insulating layer pattern 20a. The dielectric layer 32 is formed to a thickness of about 100–200 Å. The dielectric layer 32 may be formed of metal oxide or a material layer having a perovskite structure. For example, the dielectric layer 32 may be a mono layer including of a material selected from among $Ta_2O_5$, $Al_2O_3$, TaON, (Ba, Sr)$TiO_3$(BST), $SrTiO_3$ (STO), $BaTiO_3$(BTO), $PbTiO_3$, Pb(Zr, Ti)$O_3$(PZT), $SrBi_2Ta_2O_9$(SBT), (Pb, La)(Zr, Ti)$O_3$, and $Bi_4Ti_3O_{12}$ or a composite layer thereof.

Figure 1I:
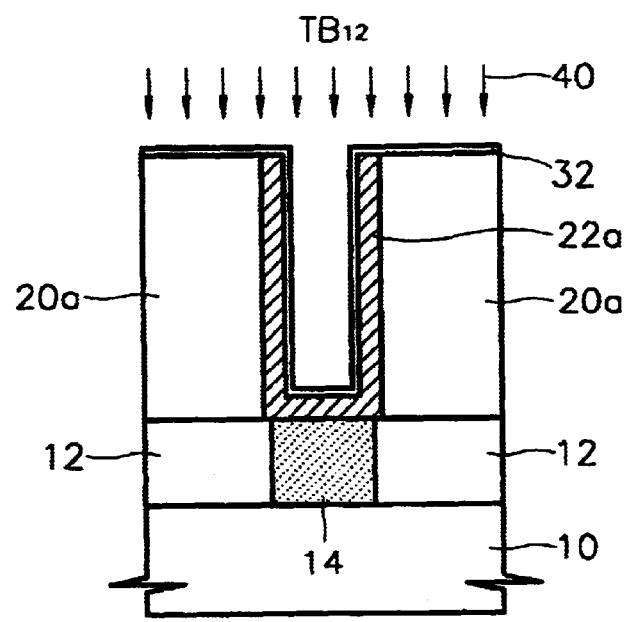

Referring to FIG. 1I, the dielectric layer 32 is heat-treated (40) using a second heat budget or thermal budget $TB_{12}$ to be crystallized. Here, the second heat budget $TB_{12}$ is adjusted smaller than the first thermal budget $TB_{11}$ applied to heat-treat the lower electrode 22a.

In order to adjust the second thermal budget $TB_{12}$ smaller than the first thermal budget $TB_{11}$, one or more of parameters including heat treatment temperature, heat treatment time, or a heat treatment method may be varied.

In a case where the second thermal budget $TB_{12}$ applied to heat-treat (40) the dielectric layer 32 to be crystallized is adjusted by controlling heat treatment temperature, the temperature required for the heat treatment (40) of the dielectric layer 32 is adjusted lower than the temperature required to heat-treat the lower electrode 22a by about 50–200° C. For example, in a case where the dielectric layer 32 is formed of $Ta_2O_5$, the dielectric layer 32 is heat-treated at a temperature of about 650° C. In a case where the second thermal budget $TB_{12}$ applied to heat-treat (40) the dielectric layer 32 is adjusted by controlling heat treatment time, the period of time, for which the dielectric layer 32 is heat-treated (40) is adjusted to be shorter than the period of time, for which the lower electrode 22a is heat-treated. In addition, in a case where the second thermal budget $TB_{12}$ applied to heat-treat (40) the dielectric layer 32 to be crystallized is adjusted by using different heat treatment methods, the dielectric layer 32 is heat-treated (40) using a heat treatment method capable of providing a relatively smaller thermal budget than the first thermal budget $TB_{11}$ applied to heat-treat (30) the lower electrode 22a. For example, the dielectric layer 32 may be heat-treated by rapid thermal annealing (RTA) or plasma annealing. At least two out of the three parameters including heat treatment temperature, heat treatment time, and a heat treatment method may be varied.

The dielectric layer 32 is preferably heat-treated (40) at a temperature of about 500–800° C. In addition, the dielectric layer 32 may be heat-treated (40) in a gas atmosphere formed of a gas selected from among $N_2$, $O_2$, $H_2$, $N_2O$, NO, $NO_2$, Ar, and $O_3$. Alternatively, the dielectric layer 32 may be heat-treated (40) in a vacuum atmosphere or a plasma atmosphere.

Figure 1J:
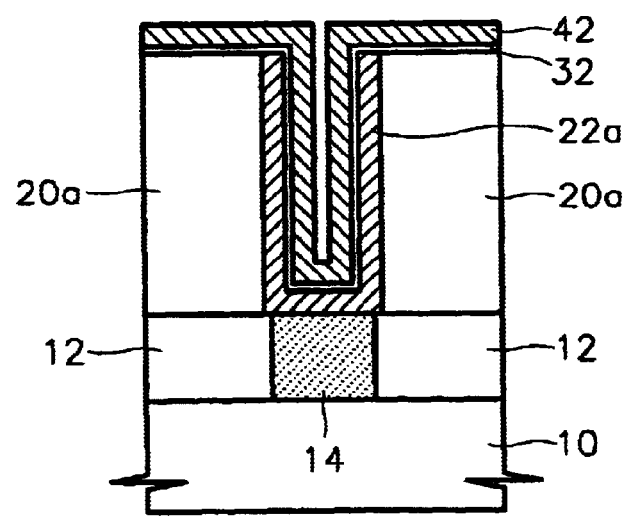

Referring to FIG. 1J, an upper electrode is formed on the dielectric layer 32 that is crystallized by the heat treatment (40). The upper electrode 42 may be formed of a noble metal, conductive noble metal oxide or conductive metal oxide. For example, the upper electrode 42 may be formed of Pt, Ru, Ir, PtO, $RuO_2$, $IrO_2$, $SrRuO_3$, $BaSrRuO_3$, or LaScCo. The upper electrode 42 is preferably formed by CVD or ALD which shows superior step coverage characteristics.

Figure 2A:
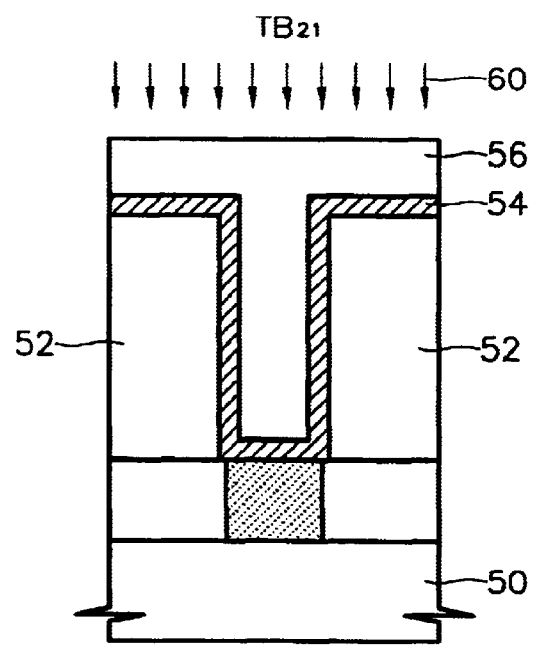
FIGS. 2A through 2C are cross-sectional views illustrating a method for manufacturing a capacitor of a semiconductor memory device according to a second embodiment of the present invention.
Figure 2B:
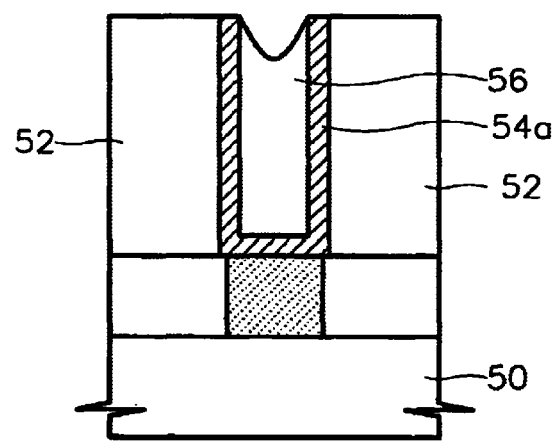
Figure 2C:
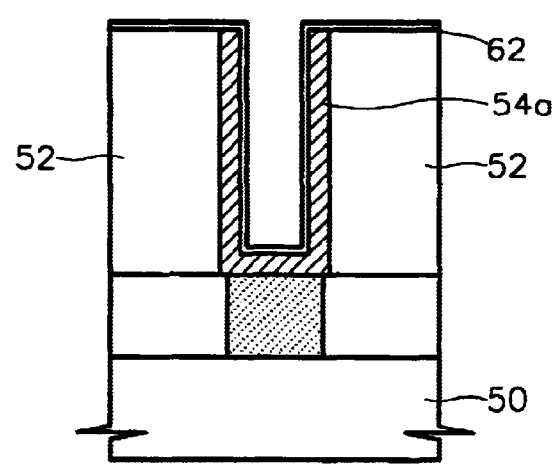

FIGS. 2A through 2C are cross-sectional views illustrating a method for manufacturing a capacitor of a semiconductor memory device according to a second embodiment of the present invention. The second embodiment is a variation of the first embodiment. In the second embodiment, unlike in the first embodiment, a lower electrode is heat-treated before patterning a conductive layer 54.

Specifically, a sacrificial insulating layer pattern 52 is formed on a semiconductor substrate 50, and the conductive layer 54 and an etching stop layer 56 are formed on the sacrificial insulating layer pattern 52 following the processes described above with reference to FIGS. 1A through 1D. Next, the conductive layer 54 is heat-treated (60) with a first thermal budget $TB_{21}$ using the etching stop layer 56 as a coagulation prevention layer. The method for heat-treating (60) the conductive layer 54 with the first thermal budget $TB_{21}$ is the same as the method for heat-treating (30) the lower electrode 22a described above with reference to FIG. 1F.

Referring to FIG. 2B, predetermined portions of the etching stop layer 56 and the conductive layer 54 that is heat-treated are removed until the conductive layer 54 covering the top surface of the sacrificial insulating layer pattern 52 is removed, thereby forming a concave-type lower electrode 54a comprised of the conductive layer 54 remaining after the removal.

Referring to FIG. 2C, the etching stop layer 56 remaining on the lower electrode 54a is removed, and an amorphous dielectric layer 62 is formed on the lower electrode 54a and the sacrificial insulating layer pattern 52.

Next, the dielectric layer 62 is heat-treated to be crystallized by using the method described above with reference to FIGS. 1I and 1J, and an upper electrode is formed on the crystallized dielectric layer 62.

Figure 3A:
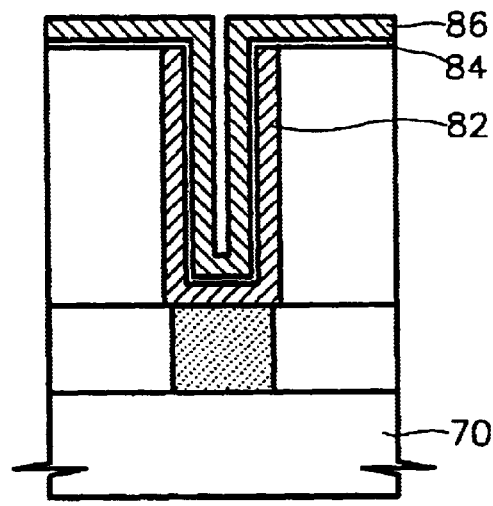
FIGS. 3A and 3B are cross-sectional views illustrating a method for manufacturing a capacitor of a semiconductor memory device according to a third embodiment of the present invention.
Figure 3B:
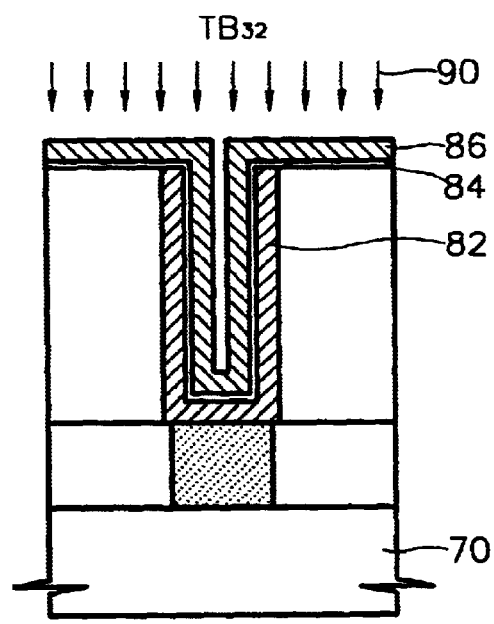

FIGS. 3A and 3B are cross-sectional views illustrating a method for manufacturing a capacitor of a semiconductor memory device according to a third embodiment of the present invention. The third embodiment is a variation of the first and second embodiments. In the third embodiment, unlike in the first and second embodiments, a dielectric layer 84 is heat-treated (90) to be crystallized after an upper electrode 86 is formed on the dielectric layer 84.

Specifically, a concave-type lower electrode 82 is formed on a semiconductor substrate 70, and the dielectric layer 84, which is amorphous, is formed on the lower electrode 82, following the processes described above with reference to FIGS. 1A through 1H or 2A through 2C. Next, as shown in FIG. 3A, the upper electrode 86 is formed on the dielectric layer 84 by the method described above with reference to FIG. 1J.

Referring to FIG. 3B, the resulting structure including the upper electrode 86 is heat-treated (90) with a second thermal budget $TB_{32}$ to crystallize the dielectric layer 84. Here, the second thermal budget $TB_{32}$ is adjusted smaller than a thermal budget required to heat-treat the lower electrode 82. The method for heat-treating (90) the dielectric layer 84 with the second thermal budget $TB_{32}$ is the same as the method for heat-treating (40) the dielectric layer 32 described above with reference to FIG. 1I.

Figure 4A:
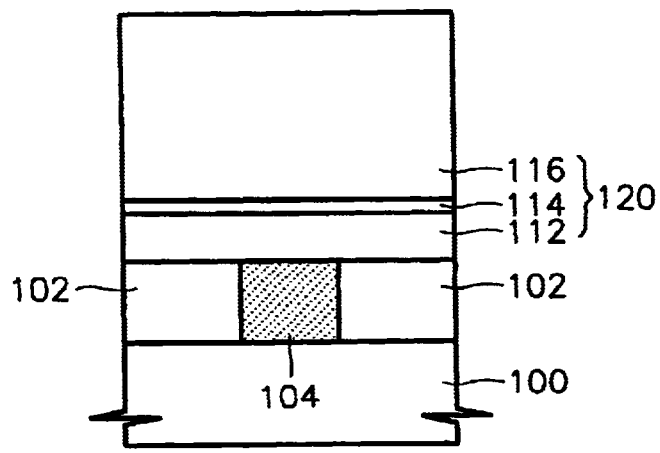
FIGS. 4A through 4J are cross-sectional views illustrating a method for manufacturing a capacitor of a semiconductor memory device according to a fourth embodiment of the present invention.

FIGS. 4A through 4J are cross-sectional views illustrating a method for manufacturing a capacitor of a semiconductor memory device according to a fourth embodiment of the present invention. Referring to FIG. 4A, a conductive plug 104 is formed through an interlayer insulating layer 102 on a semiconductor substrate 100 to contact a conductive region of the semiconductor substrate 100. Next, a sacrificial insulating layer 120 is formed to a thickness of about 10,000 Å. The conductive plug 104 may be formed of TiN. The sacrificial insulating layer 120 is used to form a mold necessary to form a lower electrode in a subsequent process and has a structure in which a first insulating layer 112, an etching stopper 114, and a second insulating layer 116 are sequentially stacked. The first and second insulating layers 112 and 116 are formed of $SiO_2$, and the etching stopper 114 is a mono layer consisting of a material selected from among $Ta_2O_5$, TaON, $TiO_2$, and $Si_3N_4$ or a composite layer thereof.

Figure 4B:
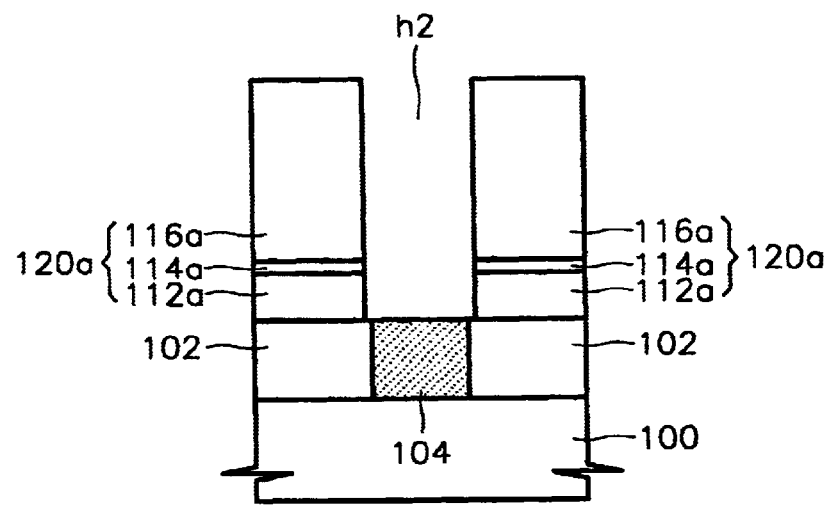

Referring to FIG. 4B, the sacrificial insulating layer 120 is patterned, thereby forming a sacrificial insulating layer pattern 120a comprised of a first insulating layer pattern 112a, an etching stopper pattern 114a, and a second insulating layer pattern 116a. The sacrificial insulating layer pattern 120a defines a storage node hole h2, through which the conductive plug 104 is exposed.

Figure 4C:
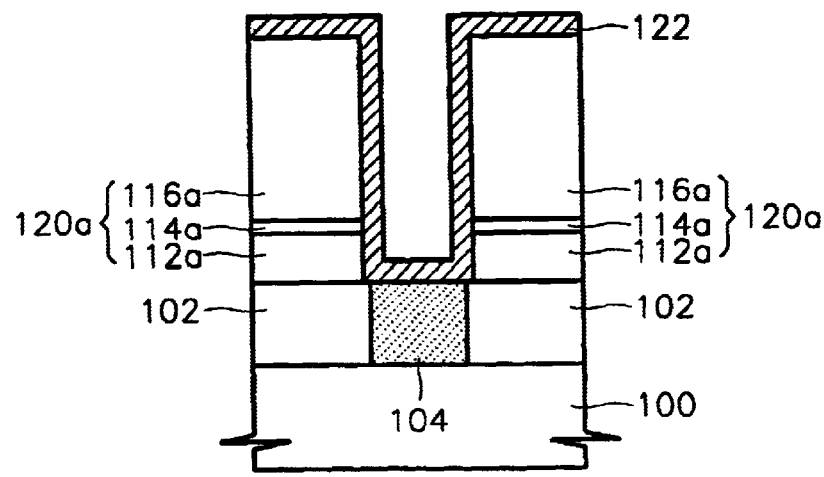

Referring to FIG. 4C, a conductive layer 122 is formed to cover the top surface and sidewalls of the sacrificial insulating layer pattern 120a and the bottom surface of the storage node hole h2, following the method described above with reference to FIG. 1C.

Figure 4D:
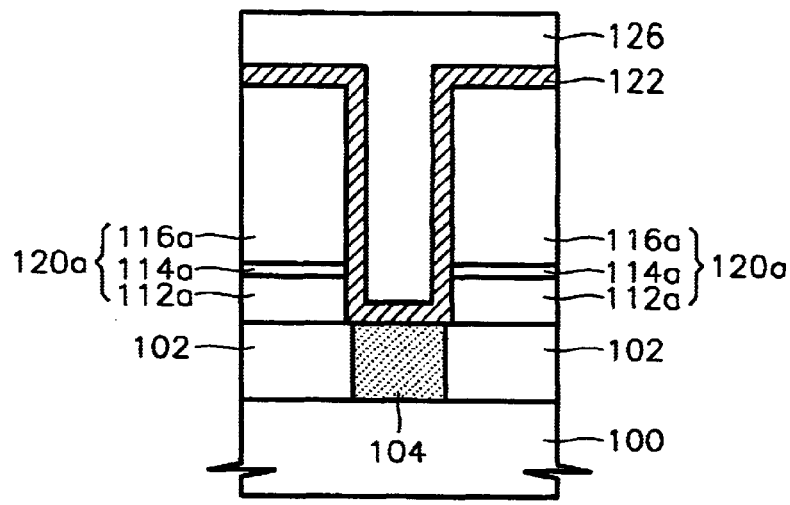

Referring to FIG. 4D, an etching stop layer 126 is formed on the conductive layer 122 using the method described above with reference to FIG. 1D.

Figure 4E:
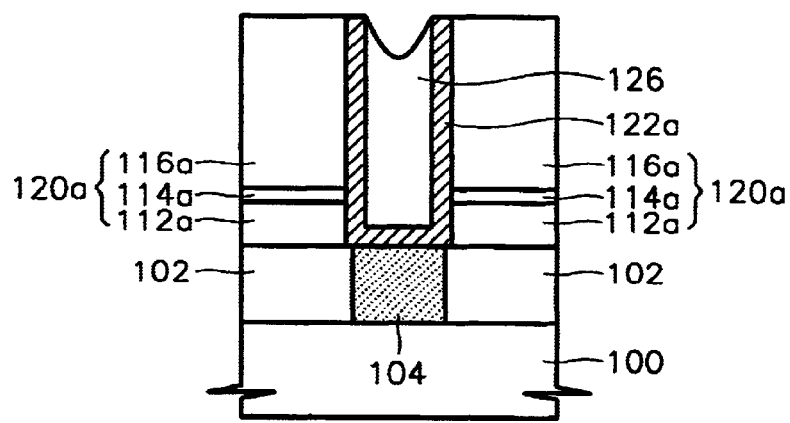

Referring to FIG. 4E, predetermined portions of the etching stop layer 126 and the conductive layer 122 are removed until the conductive layer 122 covering the top surface of the sacrificial insulating layer pattern 120a is removed, thereby forming a cylinder-type lower electrode 122a in the storage node hole h2. Here, parts of the etching stop layer 126 remain on the lower electrode 122a in the storage node hole h2.

Figure 4F:
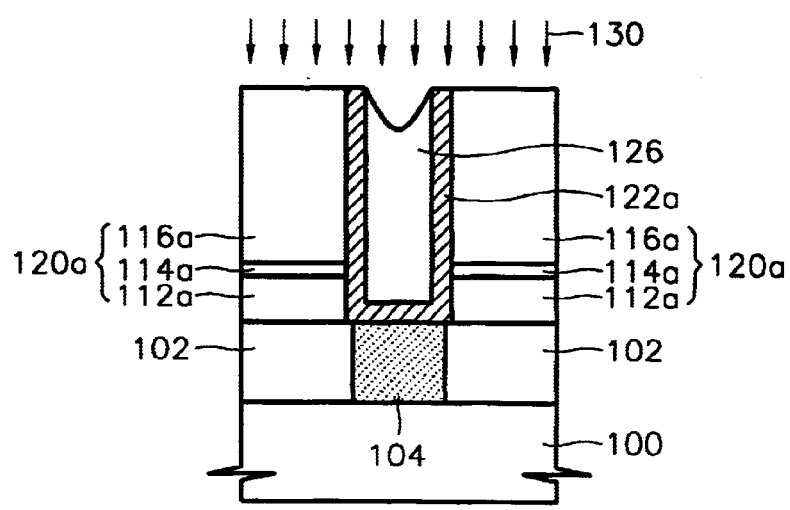

Referring to FIG. 4F, the lower electrode 122a is heat-treated (130) with a first thermal budget $TB_{41}$ by following the method described above with reference to FIG. 1F using the etching stop layer 126 as a coagulation prevention layer.

Figure 4G:
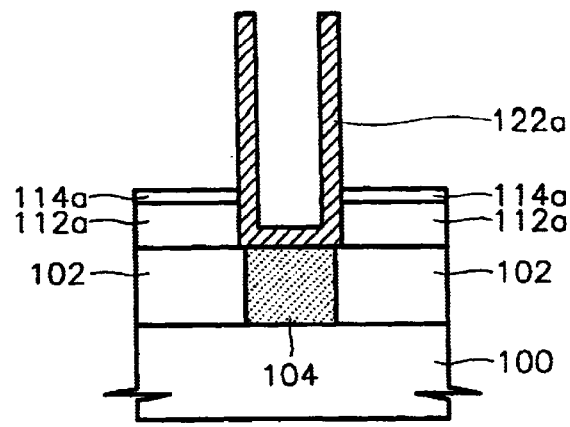

Referring to FIG. 4G, the etching stop layer 126 remaining on the lower electrode 122a that is heat-treated and the second interlayer insulating layer pattern 116a are removed by dry or wet etching so that the sidewalls of the cylinder-type lower electrode 122a are exposed.

Figure 4H:
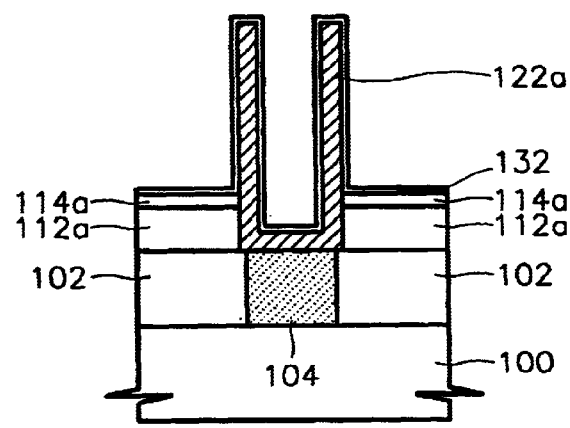

Referring to FIG. 4H, an amorphous dielectric layer 132 is formed on the lower electrode 122a and the etching stopper pattern 114a. Appropriate materials used to form the dielectric layer 132 have been mentioned above with reference to FIG. 1H.

Figure 4I:
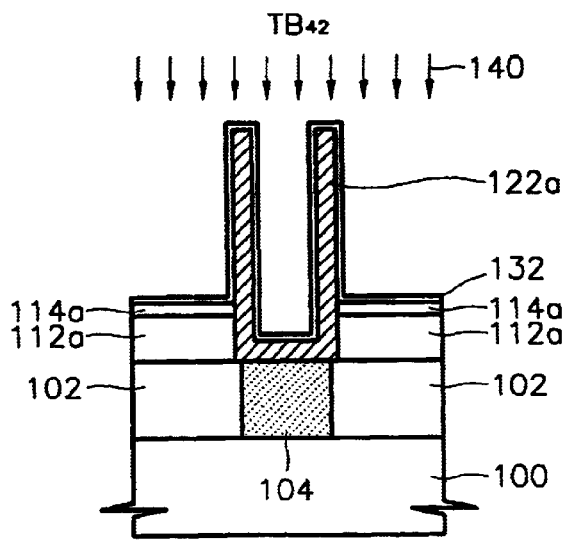

Referring to FIG. 4I, the dielectric layer 132 is heat-treated (140) with a second thermal budget $TB_{42}$ to be crystallized. Here, the second thermal budget $TB_{42}$ is adjusted to be smaller than the first thermal budget $TB_{41}$ applied to heat-treat the lower electrode 122a. The method for heat-treating the dielectric layer 132 with the second thermal budget $TB_{42}$ is the same as the method for heat-treating (40) the dielectric layer 32 described above with reference to FIG. 1I.

Figure 4J:
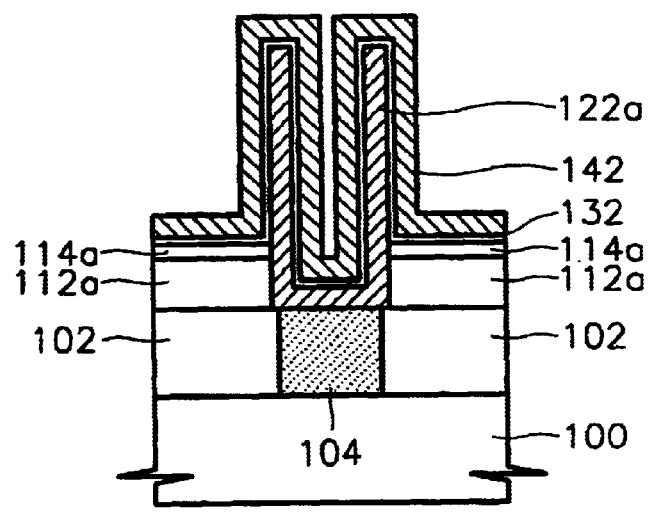

Referring to FIG. 4J, an upper electrode 142 is formed on the dielectric layer 132 that is crystallized through the heat treatment (140) using the method described above with reference to FIG. 1J.

Figure 5A:
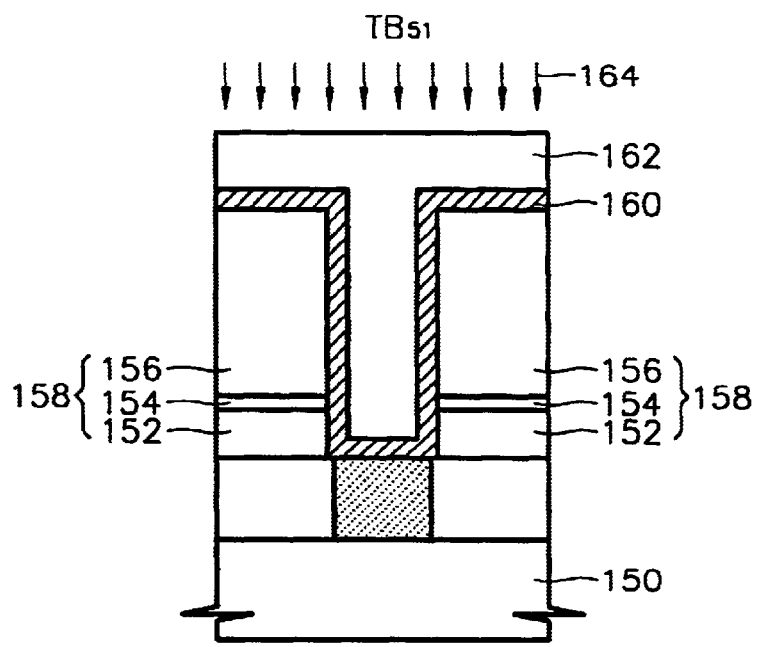
FIGS. 5A through 5C are cross-sectional views illustrating a method for manufacturing a capacitor of a semiconductor memory device according to a fifth embodiment of the present invention.
Figure 5B:
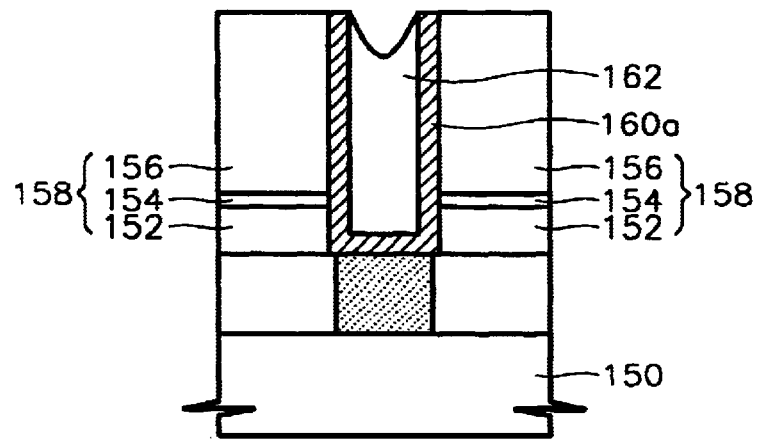
Figure 5C:
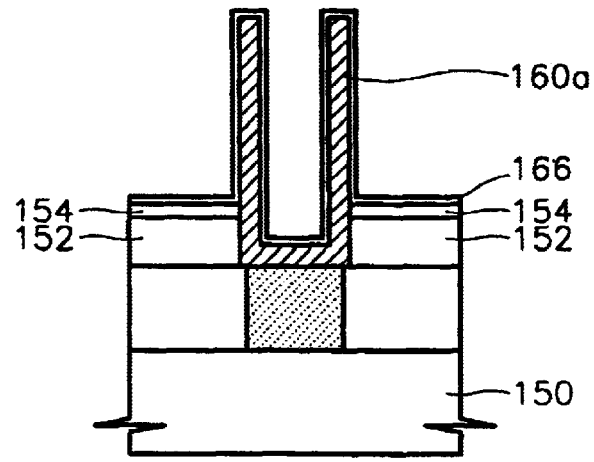

FIGS. 5A through 5C are cross-sectional views illustrating a method for manufacturing a capacitor of a semiconductor memory device according to a fifth embodiment of the present invention. The fifth embodiment is a variation of the fourth embodiment. In the fifth embodiment, unlike in the fourth embodiment, a lower electrode is heat-treated before patterning a conductive layer 160.

Specifically, a sacrificial insulating layer pattern 158 comprised of a first insulating layer pattern 152, an etching stopper pattern 154, and a second insulating layer pattern 156 is formed on a semiconductor substrate 150, and a conductive layer 160 and an etching stop layer 162 are formed on the sacrificial insulating layer pattern 158 by following the processes described above with reference to FIGS. 4A through 4D.

Next, as shown in FIG. 5A, the conductive layer 160 is heat-treated (164) with a first thermal budget $TB_{51}$ using the etching stop layer 162 as a coagulation prevention layer.

The method for heat-treating (164) the conductive layer 160 with the first thermal budget $TB_{51}$ is the same as the method for heat-treating (30) the lower electrode 22a described above with reference to FIG. 1F.

Referring to FIG. 5B, portions of the etching stop layer 162 and the conductive layer 160, which is heat-treated, are removed until the conductive layer 160 covering the top surface of the sacrificial insulating layer pattern 158 is removed, thereby forming a cylinder-type lower electrode 160a comprised of the remaining conductive layer 160.

Referring to FIG. 5C, as described above with reference to FIG. 4G, the etching stop layer 162 and the second insulating layer pattern 156 remaining on the lower electrode 160a are removed, and an amorphous dielectric layer 166 is formed on the lower electrode 160a and the etching stopper pattern 154.

Next, as described above with reference to FIGS. 4I and 4J, the dielectric layer 166 is heat-treated to be crystallized, and an upper electrode is formed on the dielectric layer 166.

Figure 6A:
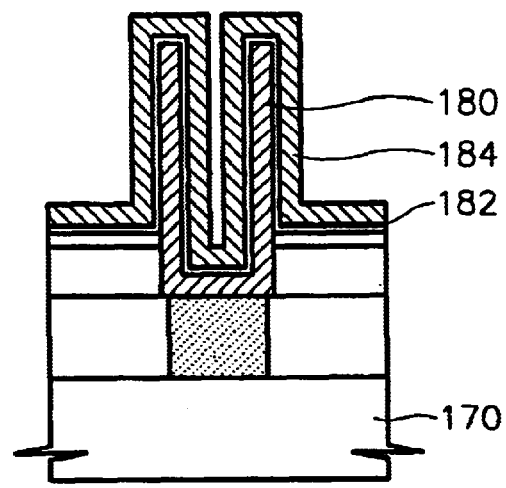
FIGS. 6A and 6B are cross-sectional views illustrating a method for manufacturing a capacitor of a semiconductor memory device according to a sixth embodiment of the present invention
Figure 6B:
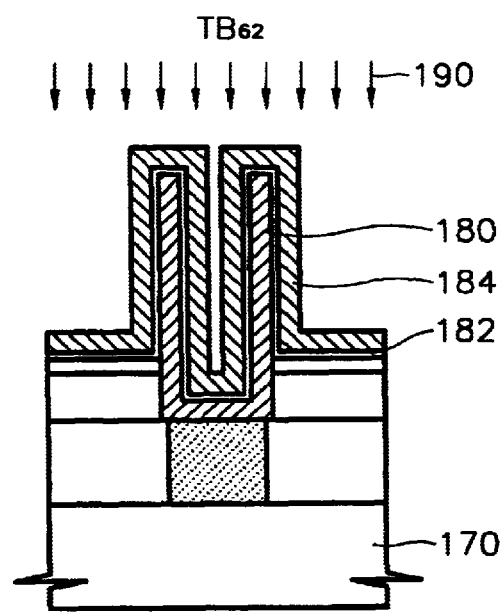

FIGS. 6A and 6B are cross-sectional views illustrating a method for manufacturing a capacitor of a semiconductor memory device according to a sixth embodiment of the present invention. The sixth embodiment is a variation of the fourth and fifth embodiments. In the sixth embodiment, unlike in the fourth and fifth embodiments, a dielectric layer 182 is heat-treated (190) after an upper electrode 184 is formed.

Specifically, as described above with reference to FIGS. 4A through 4H or 5A through 5C, a cylinder-type lower electrode 180 that is already heat-treated is formed on a semiconductor substrate 170, and an amorphous dielectric layer 182 is formed on the lower electrode 180. Next, as shown in FIG. 6A, the upper electrode 184 is formed on the dielectric layer 182 by following the process described above with reference to FIG. 4J.

Referring to FIG. 6B, a heat treatment (190) is performed on the resulting structure including the upper electrode 184 to crystallize the dielectric layer 182. Here, the dielectric layer 182 is crystallized with a second thermal budget $TB_{62}$, which is adjusted to be smaller than a thermal budget applied to heat-treat the lower electrode 180. The method for heat-treating (190) the dielectric layer 182 with the second thermal budget $TB_{62}$ is the same as the method for heat-treating (40) the dielectric layer 32 described above with reference to FIG. 1I.

Figure 7A:
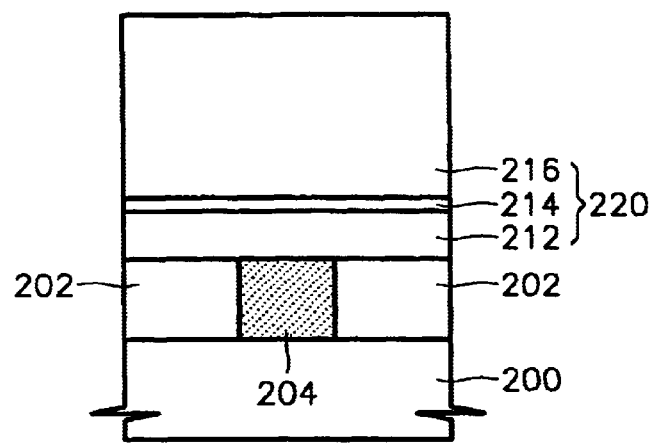
FIGS. 7A through 7I are cross-sectional views illustrating a method for manufacturing a capacitor of a semiconductor memory device according to a seventh embodiment of the present invention.

FIGS. 7A through 7I are cross-sectional views illustrating a method for manufacturing a capacitor of a semiconductor memory device according to a seventh embodiment of the present invention. Referring to FIG. 7A, a conductive plug 204 is formed through an interlayer insulating layer 202 on a semiconductor substrate 200 to contact a conductive region of the semiconductor substrate 200, and a sacrificial insulating layer 220 is formed to a thickness of about 10,000 Å on the semiconductor substrate 200. The conductive plug 204 may be formed of TiN. The sacrificial insulating layer 220 is used to form a mold necessary to form a lower electrode in a subsequent process and has a structure in which a first insulating layer 212, an etching stopper 214, and a second insulating layer 216 are sequentially stacked. The first and second insulating layers 212 and 216 are formed of $SiO_2$, and the etching stopper 214 is formed of a mono layer consisting of a material selected from among $Ta_2O_5$, TaON, $TiO_2$, and $Si_3N_4$ or a composite layer thereof.

Figure 7B:
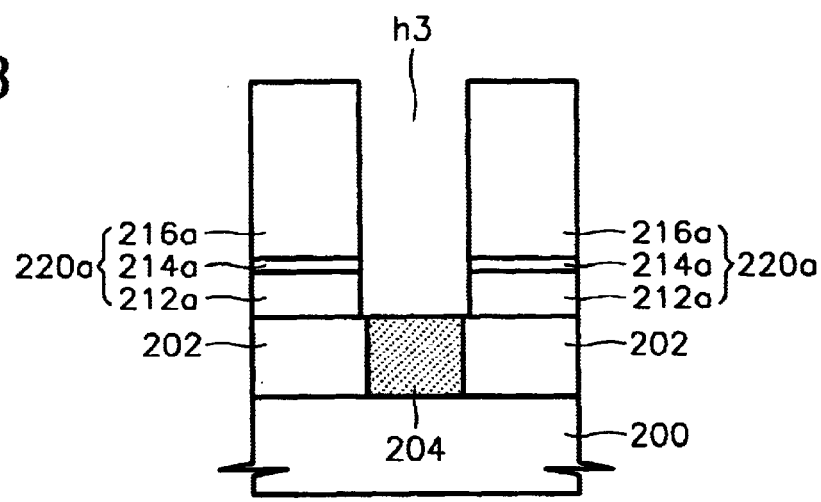

Referring to FIG. 7B, the sacrificial insulating layer 220 is patterned to form a sacrificial insulating layer pattern 220a comprised of a first insulating layer pattern 212a, an etching stopper pattern 214a, and a second insulating layer pattern 216a. The sacrificial insulating layer pattern 220a defines a storage node hole h3, through which the conductive plug 204 is exposed.

Figure 7C:
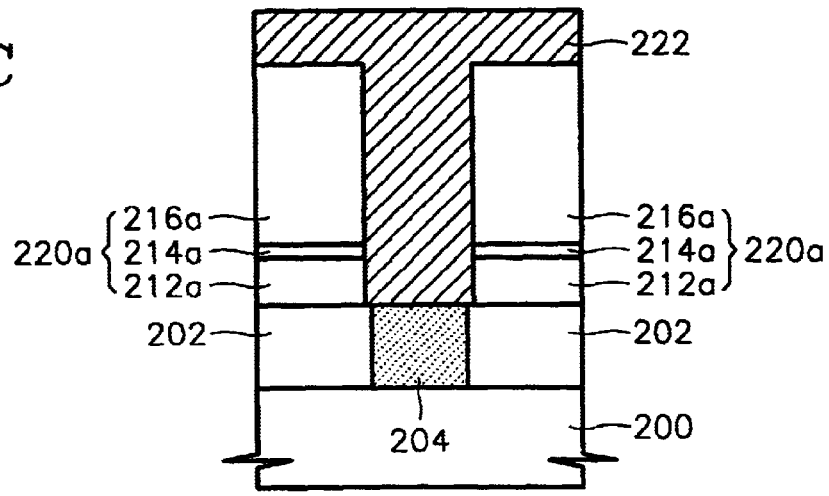

Referring to FIG. 7C, a conductive layer 222 is formed to a sufficient thickness to completely fill the storage node hole h3. The conductive layer 222 may be formed of a noble metal, such as Pt, Ru, or Ir, conductive noble metal oxide, such as PtO, $RuO_2$, or $IrO_2$, or conductive metal oxide, such as $SrRuO_3$, $BaSrRuO_3$, or LaScCo. The conductive layer 222 is preferably formed by CVD or ALD, which shows superior step coverage characteristics.

Figure 7D:
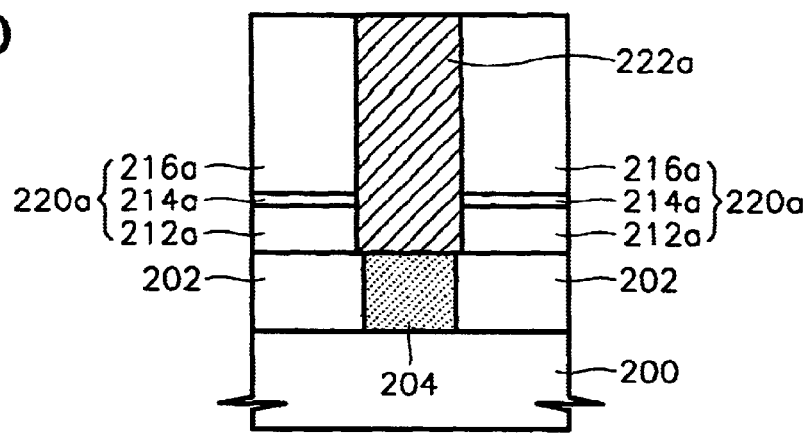

Referring to FIG. 7D, the conductive layer 222 positioned on the sacrificial insulating layer pattern 220a is removed by dry etching or CMP in order to isolate nodes from one another. As a result of the removal, a stack-type lower electrode 222a is formed in the storage node hole h3.

Figure 7E:
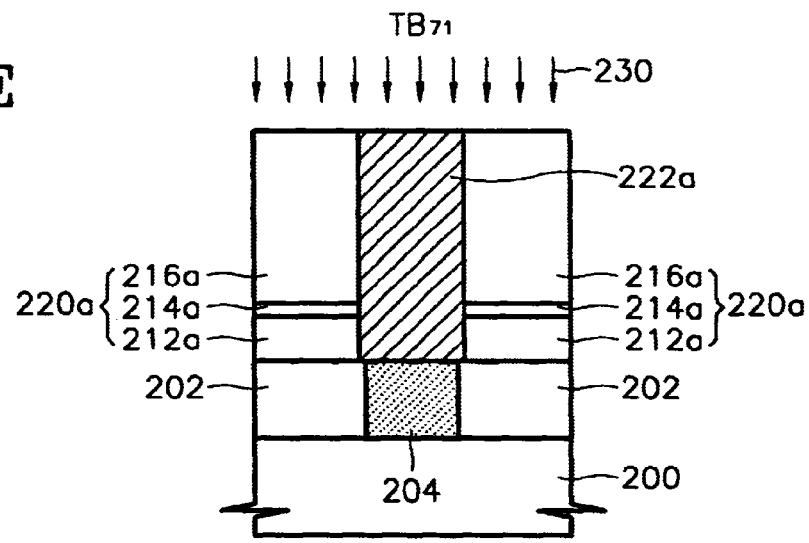

Referring to FIG. 7E, as described above with reference to FIG. 1F, the lower electrode 222a is heat-treated (230) with a first thermal budget $TB_{71}$. The first thermal budget $TB_{71}$ is adjusted to be greater than a thermal budget applied to heat-treat a dielectric layer to be crystallized.

Figure 7F:
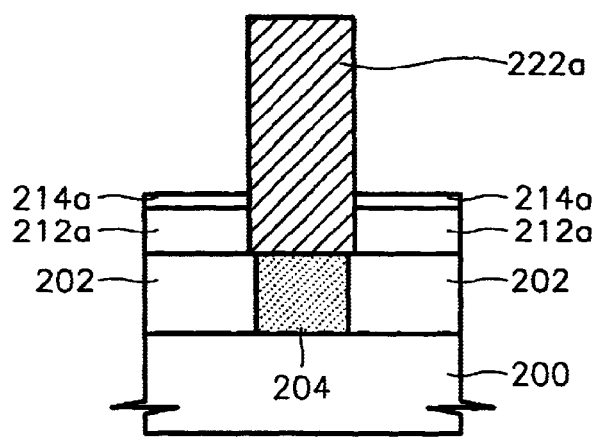

Referring to FIG. 7F, the second insulating layer pattern 216a surrounding the lower electrode 222a is removed by dry or wet etching so that the sidewalls of the stack-type lower electrode 222a are exposed.

Figure 7G:
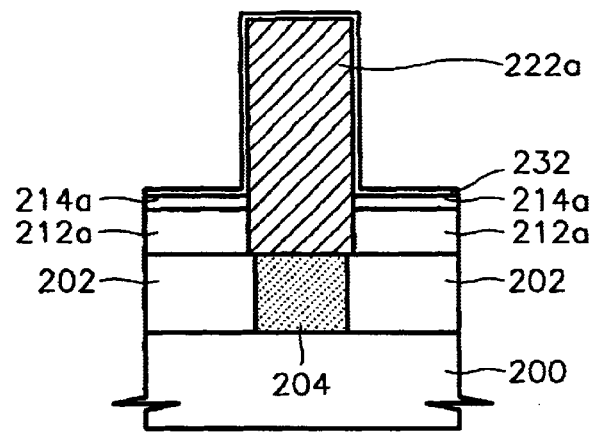

Referring to FIG. 7G, an amorphous dielectric layer 232 is formed on the lower electrode 222a and the etching stopper pattern 214a. Appropriate materials used to form the dielectric layer 232 have been mentioned above with reference to FIG. 1H.

Figure 7H:
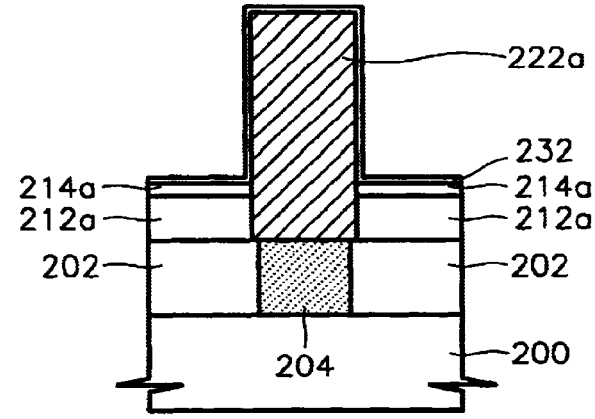

Referring to FIG. 7H, the dielectric layer 232 is heat-treated (240) with a second thermal budget $TB_{72}$ to be crystallized. The second thermal budget $TB_{72}$ is adjusted to be smaller than the first thermal budget $TB_{71}$ applied to heat-treat the lower electrode 222a. The method for heat-treating (240) the dielectric layer 232 with the second thermal budget $TB_{72}$ is the same as the method for heat-treating (40) the dielectric layer 32 described above with reference to FIG. 1I.

Figure 7I:
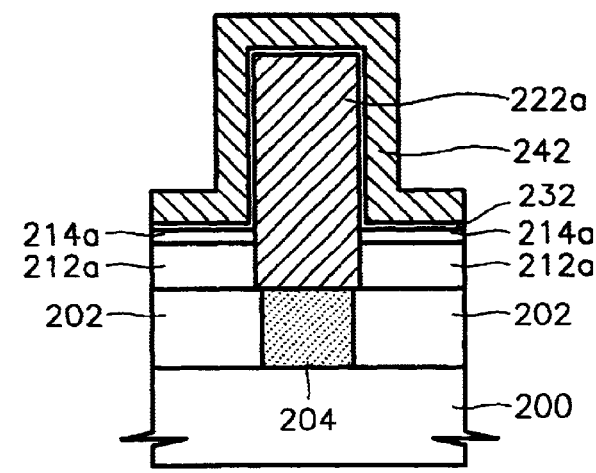

Referring to FIG. 7I, as described above with reference to FIG. 1J, an upper electrode 242 is formed on the dielectric layer 232, which is crystallized through the heat treatment 240.

The resulting structure including the upper electrode 242 may be heat-treated at a temperature of about 300–600° C. in an oxygen-based atmosphere in order to improve the electrical characteristics of a capacitor.

Figure 8A:
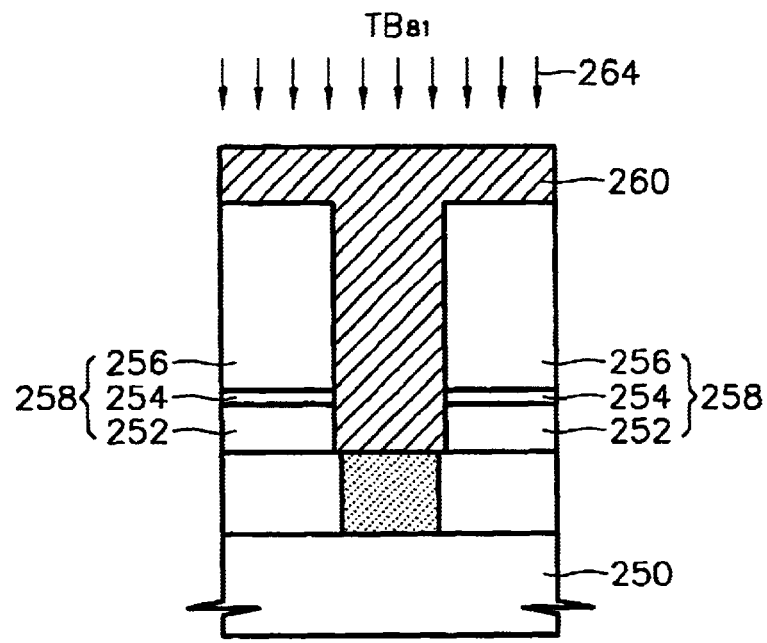
FIGS. 8A and 8B are cross-sectional views illustrating a method for manufacturing a capacitor of a semiconductor memory device according to an eighth embodiment of the present invention.
Figure 8B:
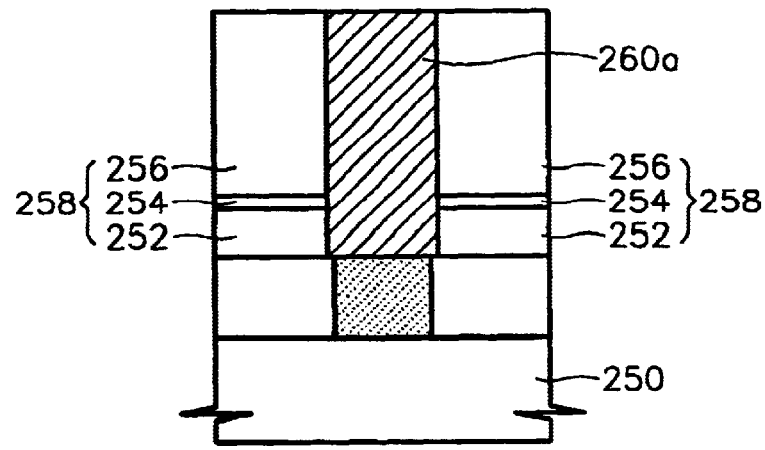

FIGS. 8A and 8B are cross-sectional views illustrating a method for manufacturing a capacitor of a semiconductor memory device according to a eighth embodiment of the present invention. The eighth embodiment is a variation of the seventh embodiment. In the eighth embodiment, unlike in the seventh embodiment, a lower electrode is heat-treated before patterning a conductive layer 260.

Specifically, as described above with reference to FIGS. 7A through 7C, a sacrificial insulating layer pattern 258 comprised of a first insulating layer pattern 252, an etching stopper pattern 254, and a second insulating layer pattern 256 is formed on a semiconductor substrate 250, and a conductive layer 260 is formed on the sacrificial insulating layer pattern 258. Next, as shown in FIG. 8A, the conductive layer 260 is heat-treated (264) with a first thermal budget $TB_{81}$. The method for heat-treating (264) the conductive layer 260 with the first thermal budget $TB_{81}$ is the same as the method for heat-treating (230) the lower electrode 222a described above with reference to FIG. 7E.

Referring to FIG. 8B, portions of the conductive layer 260 are removed by dry etching or CMP until the top surface of the sacrificial insulating layer pattern 258 is exposed, thereby forming a stack-type lower electrode 260a. Next, as described above with reference to FIGS. 7G through 7I, an amorphous dielectric layer is formed and is heat treated to be crystallized, and then an upper electrode is formed on the crystallized dielectric layer.

Figure 9A:
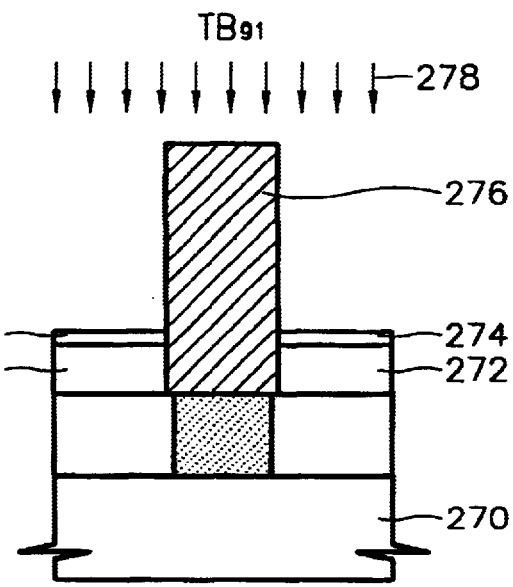
FIGS. 9A and 9B are cross-sectional views illustrating a method for manufacturing a capacitor of a semiconductor memory device according to a ninth embodiment of the present invention.
Figure 9B:
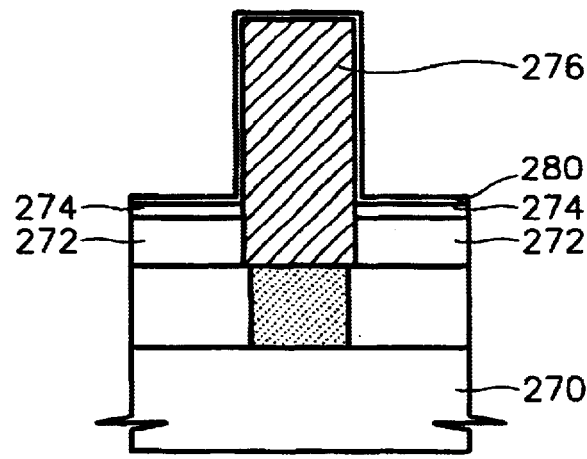

FIGS. 9A and 9B are cross-sectional views illustrating a method for manufacturing a capacitor of a semiconductor memory device according to a ninth embodiment of the present invention. The ninth embodiment is a variation of the seventh and eighth embodiments. In the ninth embodiment, a lower electrode 276 is formed through node isolation, and then a second insulating layer pattern comprising a sacrificial insulating layer pattern is removed so that only portions of the sacrificial insulating layer pattern, in other words, only a first insulating layer pattern 272 and an etching stopper pattern 274 remain and the sidewalls of the lower electrode 276 are exposed. Next, as shown in FIG. 9A, the lower electrode 276 is heat-treated (278) with a first thermal budget $TB_{91}$, which is greater than a thermal budget applied to heat-treat a dielectric layer to be crystallized. Next, as shown in FIG. 9B, a dielectric layer 280 is formed on the lower electrode 276.

Figure 10:
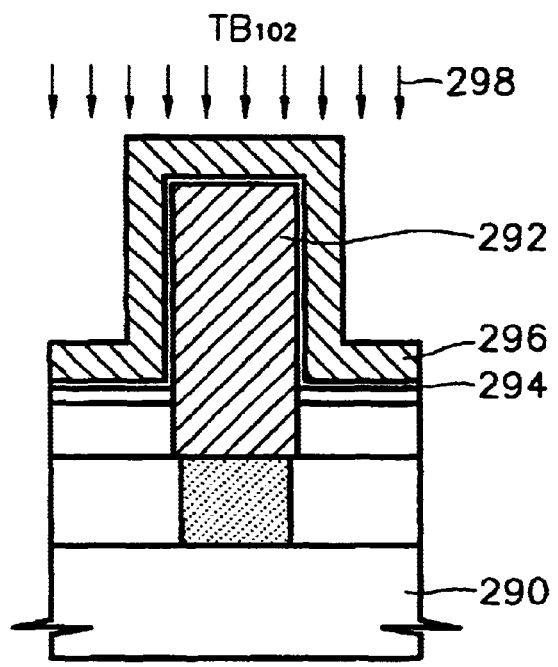
FIG. 10 is a cross-sectional view illustrating a method for manufacturing a capacitor of a semiconductor memory device according to a tenth embodiment of the present invention.

FIG. 10 is a cross-sectional view illustrating a method for manufacturing a capacitor of a semiconductor memory device according to a tenth embodiment of the present invention. The tenth embodiment is a variation of the seventh, eighth, and ninth embodiments. In the tenth embodiment, a dielectric layer 294 is heat-treated (298) to be crystallized after an upper electrode 296 is formed. That is, as described above with reference to FIGS. 7A through 7F or 9A, a stack-type lower electrode 292, which is already heat-treated, is formed on a semiconductor substrate 290, and the dielectric layer 294, which is amorphous, is formed on the lower electrode 292. Next, as described above with reference to FIG. 7I, the upper electrode 296 is formed on the dielectric layer 294. Next, the resulting structure including the upper electrode 296 is heat-treated (298) with a second thermal budget $TB_{102}$ to crystallize the dielectric layer 294. Here, the second thermal budget $TB_{102}$ is adjusted to be smaller than a thermal budget applied to heat-treat the lower electrode 292. The method for heat treating the dielectric layer 294 with the second thermal budget $TB_{102}$ is the same as the method for heat-treating (240) the dielectric layer 232 described above with reference to FIG. 7H.

Figure 11:
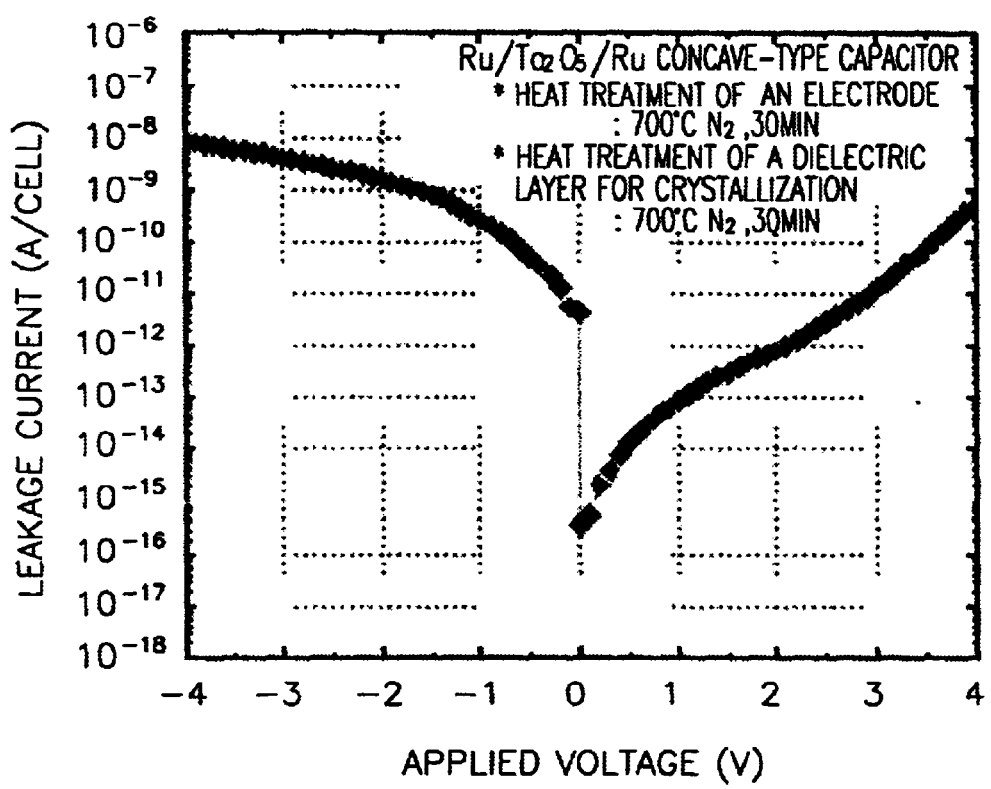
FIG. 11 is a graph illustrating the results of evaluation of a comparative example used to evaluate the leakage current characteristics of a capacitor manufactured according to the present invention.
Figure 12:
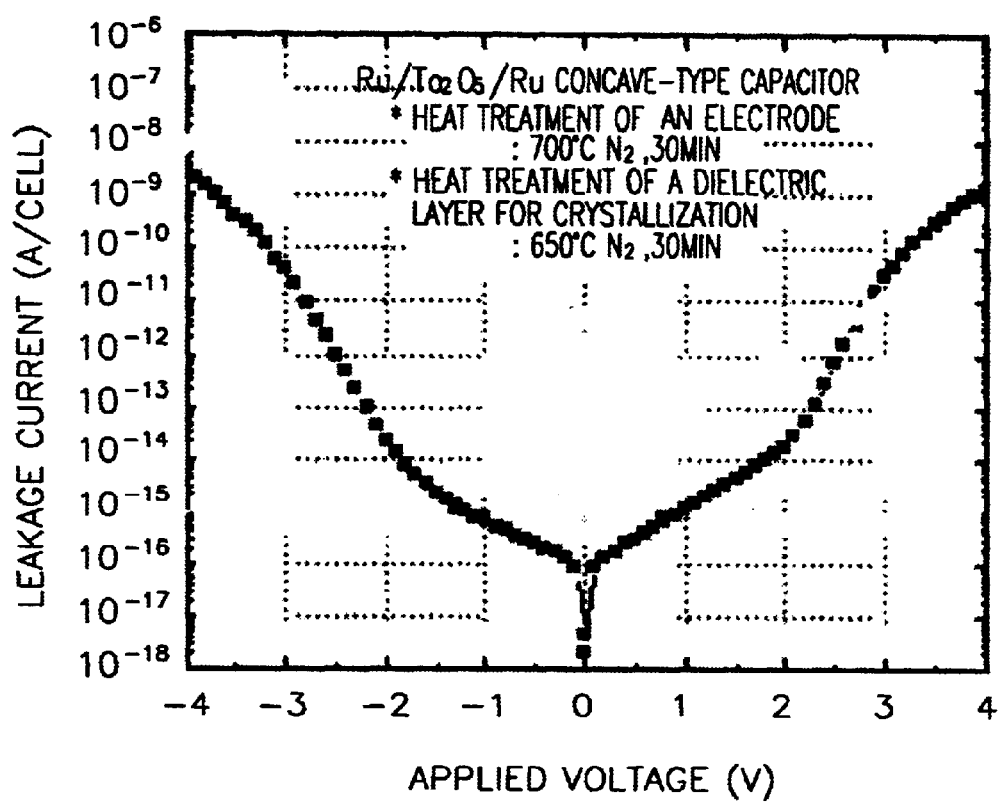
FIG. 12 is a graph illustrating the results of evaluation of the leakage current characteristics of a capacitor manufactured according to the present invention.

FIGS. 11 and 12 are graphs showing the results of evaluation of the electrical characteristics of a capacitor manufactured according to the present invention. Specifically, FIG. 11 is a graph showing the results of the leakage current characteristics of a capacitor manufactured by applying the same thermal budget to both the case of heat-treating a lower electrode and the case of heat-treating a dielectric layer. The capacitor used for the evaluation was manufactured according to the first embodiment of the present invention described above with reference to FIGS. 1A through 1J, and a lower electrode formed of Ru and a dielectric layer formed of $Ta_2O_5$ were separately heat-treated in an $N_2$ atmosphere at a temperature of 700° C. for 30 minutes, using furnaces.

FIG. 12 is a graph showing the results of evaluation of the leakage current characteristics of a capacitor manufactured by adjusting a thermal budget applied to heat-treat a lower electrode to be greater than a thermal budget applied to heat-treat a dielectric layer to be crystallized, like in the embodiments of the present invention. The capacitor used for the evaluation was manufactured according to the first embodiment of the present invention described above with reference to FIGS. 1A through 1J. A lower electrode formed of Ru and a dielectric layer formed of $Ta_2O_5$ were separately heat-treated using furnaces. The lower electrode was heat-treated in an $N_2$ atmosphere at a temperature of 700° C. for 30 minutes, and the dielectric layer was heat-treated in an $N_2$ atmosphere at a temperature of 650° C. for 30 minutes so that the thermal budget applied to heat-treat the lower electrode could be adjusted greater than the thermal budget applied to heat-treat the dielectric layer.

As shown in FIGS. 11 and 12, if a lower electrode is heat-treated with a thermal budget which is greater than a thermal budget applied to heat-treat a dielectric layer, a capacitor having superior leakage current characteristics is realized.

In the method for manufacturing a capacitor of a semiconductor memory device according to the present invention, a lower electrode is heat-treated with a thermal budget, which is greater than a thermal budget applied to heat-treat a dielectric layer to be crystallized, in order to prevent the lower electrode from being deformed during heat-treating the dielectric layer. Accordingly, the lower electrode can be sufficiently coarsened through grain growth before heat treating the dielectric layer. In addition, it is possible to obtain a capacitor having stable leakage current characteristics required to operate a device by effectively preventing tensile stress from affecting the dielectric layer due to the deformation of the lower electrode in the heat treatment of the dielectric layer, and thus it is possible to improve the electrical characteristics of the capacitor. Since an etching stop layer used to protect the lower electrode from a process of isolating nodes from one another serves as a coagulation prevention layer in the heat treatment of the lower electrode, it is possible to prevent the physical and electrical characteristics of the capacitor from deteriorating due to coagulation of the lower electrode without additionally forming a coagulation prevention layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a capacitor of a semiconductor memory device comprising:

forming a lower electrode on a semiconductor substrate;

forming a coagulation prevention layer on the lower electrode;

heat-treating the lower electrode with a first thermal budget after forming the coagulation prevention layer;

forming a dielectric layer on the heat-treated lower electrode; and crystallizing the dielectric layer by heat-treating the dielectric layer with a second thermal budget which is smaller than the first thermal budget.

2. The method of claim 1, wherein the lower electrode is formed of at least one of a noble metal, a conductive noble metal oxide, and a conductive metal oxide.

3. The method of claim 2, wherein the lower electrode is formed of at least one of Pt, Ru, Ir, PtO, $RuO_2$, $IrO_2$, $SrRuO_3$, $BaSrRuO_3$, and LaScCo.

4. The method of claim 1, wherein the dielectric layer is formed of at least one of a metal oxide layer and a material layer having a perovskite structure.

5. The method of claim 4, wherein the dielectric layer is a mono layer including a material selected from among $Ta_2O_5$, $Al_2O_3$, TaON, (Ba, Sr)$TiO_3$(BST), $SrTiO_3$(STO), $BaTiO_3$(BTO), $PbTiO_3$, Pb(Zr, Ti)$O_3$(PZT), $SrBi_2Ta_2O_9$ (SBT), (Pb, La)(Zr, Ti)$O_3$, and $Bi_4Ti_3O_{12}$ and a composite layer thereof.

6. The method of claim 1, wherein in heat-treating the lower electrode and crystallizing the dielectric layer, the first and second thermal budgets are adjusted by controlling any of the temperature, time, and method of their respective heat treatments.

7. The method of claim 6, wherein in heat-treating the lower electrode and crystallizing the dielectric layer, the first and second thermal budgets are adjusted by controlling the temperature of their respective heat treatments.

8. The method of claim 7, wherein the dielectric layer is heat-treated at a first temperature which is higher than the crystallization temperature of the dielectric layer, and the lower electrode is heat-treated at a second temperature which is higher than the first temperature by 50–200° C.

9. The method of claim 6, wherein in heat-treating the lower electrode and crystallizing the dielectric layer, the first and second thermal budgets are adjusted by controlling the time of their respective heat treatments.

10. The method of claim 9, wherein the period of time, for which the lower electrode is heat-treated is longer than the period of time, for which the dielectric layer is heat-treated.

11. The method of claim 10, wherein the lower electrode and the dielectric layer are heat-treated using furnaces, and the period of time, for which the lower electrode is heat-treated, is longer than the period of time, for which the dielectric layer is heat-treated, by 30 minutes–2 hours.

12. The method of claim 6, wherein in heat-treating the lower electrode and crystallizing the dielectric layer, the first and second thermal budgets are adjusted by using different heat-treatment methods.

13. The method of claim 12, wherein a heat treatment using a furnace is used to obtain the first thermal budget in heat-treating the lower electrode, and rapid thermal annealing (RTA) or plasma annealing is used to obtain the second thermal budget in crystallizing the dielectric layer.

14. The method of claim 6, wherein in heat-treating the lower electrode and crystallizing the dielectric layer, the first and second thermal budgets are adjusted by controlling at least two out of the temperature, time, and method of their respective heat treatments.

15. The method of claim 1, wherein the lower electrode is heat-treated at a temperature of 500–850° C.

16. The method of claim 1, wherein the lower electrode is heat-treated in a gas atmosphere generated from a gas selected from among $N_2$, $O_2$, $H_2$, $N_2O$, NO, $NO_2$, Ar, and $O_3$.

17. The method of claim 1, wherein the lower electrode is heat-treated in a vacuum atmosphere.

18. The method of claim 1, wherein the dielectric layer is heat-treated in a gas atmosphere generated from a gas selected from among $N_2$, $O_2$, $H_2$, $N_2O$, NO, $NO_2$, Ar, and $O_3$.

19. The method of claim 1, wherein the dielectric layer is heat-treated in a vacuum atmosphere.

20. The method of claim 1, wherein the coagulation prevention layer is a mono layer including a material selected from among $SiO_2$, photoresist, $Si_3N_4$, $Ta_2O_5$, $Al_2O_3$, $SrTiO_3$(STO), (Ba, Sr)$TiO_3$(BST), $PbTiO_3$, Pb(Zr, Ti)$O_3$(PZT), $SrBiTa_2O_5$(SBT), (Pb, La)(Zr, Ti)$O_3$, $Bi_4Ti_3O_{12}$, $BaTiO_3$(BTO), organic polymer and a composite layer thereof.

21. The method of claim 1 further comprising removing the coagulation prevention layer after heat-treating the lower electrode with the first thermal budget.

22. The method of claim 21, wherein the coagulation prevention layer is removed by dry or wet etching.

23. The method of claim 1 further comprising:
forming a sacrificial insulating layer pattern on the semiconductor substrate to define a storage node hole,
wherein the lower electrode is formed at the sidewalls of the sacrificial insulating layer pattern in the storage node hole.

24. The method of claim 23, wherein the sacrificial insulating layer pattern is formed of $SiO_2$.

25. The method of claim 24, wherein forming the lower electrode comprises:
forming a conductive layer covering the top surface and sidewalls of the sacrificial insulating layer pattern and the bottom surface of the storage node hole;
forming an etching stop layer to a sufficient thickness to completely fill the storage node hole on the conductive layer;
forming a concave-type lower electrode comprised of the conductive layer remaining only in the storage node hole by removing portions of the etching stop layer and the conductive layer until the conductive layer covering the top surface of the sacrificial insulating layer pattern is removed; and
removing the etching stop foyer remaining in the storage node hole.

26. The method of claim 25, wherein the conductive layer is formed of at least one of Pt, Ru, Ir, PtO, $RuO_2$, $IrO_2$, $SrRuO_3$, $BaSrRuO_3$, and LaScCo.

27. The method of claim 25, wherein the etching stop layer is a mono layer including a material selected from among $SiO_2$, photoresist, $Si_3N_4$, $Ta_2O_5$, $Al_2O_3$, $SrTiO_3$ (STO), (Ba, Sr)$TiO_3$(BST), $PbTiO_3$, Pb(Zr, Ti)$O_3$(PZT), $SrBi_2Ta_2O_5$(SBT), (Pb, La)(Zr, Ti)$O_3$, $Bi_4Ti_3O_{12}$, $BaTiO_3$ (BTO), organic polymer and a composite layer thereof.

28. The method of claim 25, wherein the lower electrode is heat-treated with the first thermal budget using the etching stop layer as a coagulation prevention layer before removing the etching stop layer remaining in the storage node hole.

29. The method of claim 24, wherein the dielectric layer is formed on the sacrificial insulating layer pattern and the lower electrode.

30. The method of claim 23, wherein the sacrificial insulating layer pattern has a structure, in which a first insulating layer pattern, an etching stopper pattern, and a second insulating layer pattern are sequentially stacked.

31. The method of claim 30, wherein the first insulating layer is formed of $SiO_2$, the etching stopper pattern is a mono layer including a material selected from among $Ta_2O_5$, TaON, $TiO_2$, $Si_3N_4$ and a composite layer thereof, and the second insulating layer pattern is formed of $SiO_2$.

32. The method of claim 30, wherein forming the lower electrode comprises:
forming a conductive layer covering the top surface and sidewalls of the sacrificial insulating layer pattern and the bottom surface of the storage node hole;

forming an etching stop layer to a sufficient thickness to completely fill the storage node hole on the conductive layer;

forming a cylinder-type lower electrode comprised of the conductive layer remaining only in the storage node hole by removing portions of the etching stop layer and the conductive layer until the conductive layer covering the sacrificial insulating layer pattern is removed; and removing the etching stop layer remaining in the storage node hole.

33. The method of claim 32, wherein the conductive layer is formed of at least one of Pt, Ru, Ir, PtO, $RuO_2$, $IrO_2$, $SrRuO_3$, $BaSrRuO_3$, and LaScCo.

34. The method of claim 32, wherein the etching stop layer is a mono layer including a material selected from among $SiO_2$, photoresist, $Si_3N_4$, $Ta_2O_5$, $Al_2O_3$, $SrTiO_3$ (STO), (Ba, Sr)$TiO_3$(BST), $PbTiO_3$, Pb(Zr, Ti)$O_3$(PZT), $SrBi_2O_5$(SBT), (Pb, La)(Zr, Ti)$O_3$, $Bi_4Ti_3O_{12}$, $BaTiO_3$ (BTO), organic polymer and a composite layer thereof.

35. The method of claim 32, wherein the lower electrode is heat-treated with the first thermal budget using the etching stop layer as a coagulation prevention layer before removing the etching stop layer remaining in the storage node hole.

36. The method of claim further comprising:

removing the first insulating layer pattern after heat-treating the lower electrode with the first thermal budget, wherein the dielectric layer is formed on the etching stopper pattern and the lower electrode.

37. The method of claim 30, wherein forming the lower electrode comprises:

forming a conductive layer to a sufficient thickness to completely fill the storage node hole on the semiconductor substrate, on which the sacrificial insulating layer pattern is formed; and forming a stack-type lower electrode comprised of the conductive layer remaining only in the storage node hole by removing the conductive layer on the sacrificial insulating layer pattern.

38. The method of claim 37, wherein the conductive layer is formed of at least one of Pt, Ru, Ir, PtO, $RuO_2$, $IrO_2$, $SrRuO_3$, $BaSrRuO_3$, and LaScCo.

39. The method of claim 37 further comprising removing the first insulating layer pattern after heat-treating the lower electrode with the first thermal budget, wherein the dielectric layer is formed on the etching stopper pattern and the lower electrode.

40. The method of claim 1 further comprising forming an upper electrode on the dielectric layer, wherein the dielectric layer is heat-treated with the second thermal budget before forming the upper electrode.

41. The method of claim 1 further comprising forming an upper electrode on the dielectric layer, wherein the dielectric layer is heat-treated with the second thermal budget after forming the upper electrode.

42. The method of claim 40, wherein the upper electrode is formed of at least one of a noble metal, a conductive noble metal oxide, and a conductive metal oxide.

43. The method of claim 42, wherein the upper electrode is formed of at least one of Pt, Ru, Ir, PtO, $RuO_2$, $IrO_2$, $SrRuO_3$, $BaSrRuO_3$, and LaScCo.

44. The method of claim 41, wherein the upper electrode is formed of at least one of a noble metal, a conductive noble metal oxide, and a conductive metal oxide.

45. The method of claim 44, wherein the upper electrode is formed of at least one of Pt, Ru, Ir, PtO, $RuO_2$, $IrO_2$, $SrRuO_3$, $BaSrRuO_3$, and LaScCo.

46. A method for manufacturing a capacitor of a semiconductor memory device comprising:

forming a conductive layer on a semiconductor substrate;

forming a coagulation prevention layer on the conductive layer;

heat-treating the conductive layer with a first thermal budget after forming the coagulation layer;

forming a lower electrode by patterning the conductive layer;

forming a dielectric layer on the heat-treated lower electrode;

crystallizing the dielectric layer by host-treating the dielectric layer with a second thermal budget which is smaller than the first thermal budget; and forming an upper electrode on the dielectric layer.

47. The method of claim 46, wherein the conductive layer is formed of at least one of Pt, Ru, Ir, PtO, $RuO_2$, $IrO_2$, $SrRuO_3$, $BaSrRuO_3$, and LaScCo.

48. The method of claim 46 further comprising:

forming an etching stop layer on the conductive layer; and removing the etching stop layer after forming the lower electrode, wherein the conductive layer is heat-treated with the first thermal budget after forming the etching stop layer.

49. The method of claim 48, wherein the etching stop layer is a mono layer including a material selected from among $SiO_2$, photoresist, $Si_3N_4$, $Ta_2O_5$, $Al_2O_3$, $SrTiO_3$ (STO), (Ba, Sr)$TiO_3$(BST), $PbTiO_3$, Pb(Zr, Ti)$O_3$(PZT), $SrBi_2Ta_2O_5$(SBT), (Pb, La)(Zr, Ti)$O_3$, $Bi_4Ti_3O_{12}$, $BaTiO_3$ (BTO), organic polymer and a composite layer thereof.

50. The method of claim 46, wherein the dielectric layer is formed of at least one of a metal oxide layer and a material layer having a perovskite structure.

51. The method of claim 50, wherein the dielectric layer is mono layer including a material selected from among $Ta_2O_5$, $Al_2O_3$, TaON, (Ba, Sr)$TiO_3$(BST), $SrTiO_3$(STO), $BaTiO_3$(BTO), $PbTiO_3$, Pb(Zr, Ti)$O_3$(PZT), $SrBi_2Ta_2O_9$ (SBT), (Pb, La)(Zr, Ti)$O_3$, $Bi_4Ti_3O_{12}$ and a composite layer thereof.

52. The method of claim 46, wherein the in heat-treating the conductive layer end crystallizing the dielectric layer, the first and second thermal budgets are adjusted by controlling any of the temperature, time, and method of their respective heat treatments.

53. The method of claim 52, wherein in heat-treating the conductive layer and crystallizing the dielectric layer, the first and second thermal budgets are adjusted by controlling the temperature of their respective heat treatments.

54. The method of claim 53, wherein the dielectric layer is heat-treated at a first temperature which is higher than the crystallization temperature of the dielectric layer, and the conductive layer is heat-treated at a second temperature which is higher than the first temperature by 50–200° C.

55. The method of claim 52, wherein in heat-treating the conductive layer and crystallizing the dielectric layer, the first and second thermal budgets are adjusted by controlling the time of their respective heat treatments.

56. The method of claim 55, wherein the period of time for which the conductive layer is heat-treated is longer than the period of time for which the dielectric layer is heat-treated.

57. The method of claim 56, wherein the conductive layer and the dielectric layer are beat-treated using furnaces, and the period of time for which the conductive layer us heat-treated is longer than the period of time for which the dielectric layer is heat-treated by 30 minutes–2 hours.

58. The method of claim 52, wherein in heat-treating the conductive layer and crystallizing the dielectric layer, the first and second thermal budgets are adjusted by using different heat-treatment methods.

59. The method of claim 58, wherein a heat treatment using a furnace is used to obtain the first thermal budget in heat-treating the conductive layer, and at least one of rapid thermal annealing (RTA) and plasma annealing is used to obtain the second thermal budget in crystallizing the dielectric layer.

60. The method of claim 52, wherein in heat-treating the conductive layer and crystallizing the dielectric layer, the first and second thermal budgets are adjusted by controlling at least two out of the temperature, time, and method of their respective heat treatments.

61. The method of claim 46, wherein the conductive layer is heat-treated at a temperature of 500–850° C.

62. The method of claim 46, wherein the conductive layer is heat-treated in a gas atmosphere generated from a gas selected from among $N_2$, $O_2$, $H_2$, $N_2O$, NO, $NO_2$, Ar, and $O_3$.

63. The method of claim 46, wherein the conductive layer is heat-treated in a vacuum atmosphere.

64. The method of claim 46, wherein the dielectric layer is heat-treated in a gas atmosphere generated from a gas selected from among $N_2$, $O_2$, $H_2$, $N_2O$, NO, $NO_2$, Ar, end $O_3$.

65. The method of claim 46, wherein the dielectric layer is heat-treated in a vacuum atmosphere.

66. The method of claim 46, wherein the lower electrode is formed as one of a concave type, cylinder type, and a stack type.

67. The method of claim 46, wherein the upper electrode is formed of at least one of Pt, Ru, Ir, PtO, $RuO_2$, $IrO_2$, $SrRuO_3$, $BaSrRuO_3$, and LaScCo.

* * * * *

UNITED STATES PATENT AND TRADEMARK OFFICE
CERTIFICATE OF CORRECTION

PATENT NO. : 6,815,221 B2  
DATED : November 9, 2004  
INVENTOR(S) : Wan-don Kim et al.

It is certified that error appears in the above-identified patent and that said Letters Patent is hereby corrected as shown below:

Column 16,  
Line 7, please replace "$SrBiTa_2O_5(SBT)$" with -- $SrBi_2Ta_2O_5(SBT)$ --.  
Line 37, please delete "foyer" and insert -- layer --.

Column 17,  
Line 18, please replace "$SrBi_2O_5(SBT)$" with -- $SrBi_2Ta_2O_5(SBT)$ --.  
Line 24, after "claim", please insert -- 32, --.

Column 18,  
Line 12, please delete "host" and insert -- heat --.  
Line 63, please delete "beat" and insert -- heat --.

Signed and Sealed this

Twelfth Day of April, 2005

JON W. DUDAS  
*Director of the United States Patent and Trademark Office*